United States Patent
Harada et al.

(10) Patent No.: US 10,948,426 B2
(45) Date of Patent: Mar. 16, 2021

(54) PARTICLE BEAM DEVICE, OBSERVATION METHOD, AND DIFFRACTION GRATING

(71) Applicant: RIKEN, Wako (JP)

(72) Inventors: Ken Harada, Wako (JP); Keiko Shimada, Wako (JP); Kodai Niitsu, Wako (JP)

(73) Assignee: RIKEN, Saitama (JP)

( * ) Notice: Subject to any disclaimer, the term of this patent is extended or adjusted under 35 U.S.C. 154(b) by 118 days.

(21) Appl. No.: 16/094,839

(22) PCT Filed: Apr. 6, 2017

(86) PCT No.: PCT/JP2017/014393
§ 371 (c)(1),
(2) Date: Mar. 15, 2019

(87) PCT Pub. No.: WO2017/183472
PCT Pub. Date: Oct. 26, 2017

(65) Prior Publication Data
US 2019/0196070 A1 Jun. 27, 2019

(30) Foreign Application Priority Data
Apr. 19, 2016 (JP) .............................. JP2016-083746

(51) Int. Cl.
*G01N 23/04* (2018.01)
*H01J 37/295* (2006.01)
(Continued)

(52) U.S. Cl.
CPC ........... *G01N 23/04* (2013.01); *G02B 5/1876* (2013.01); *H01J 37/10* (2013.01); *H01J 37/20* (2013.01);
(Continued)

(58) Field of Classification Search
USPC ........................................................ 250/307
See application file for complete search history.

(56) References Cited

U.S. PATENT DOCUMENTS 4,376,891 A * 3/1983 Rauscher .............. H01J 37/295
250/307
6,222,812 B1 * 4/2001 Yoo .................... G02B 27/0944
369/112.16
(Continued)

FOREIGN PATENT DOCUMENTS

| JP | 2009-123477 A | 6/2009 |
| JP | 2010-533352 A | 10/2010 |

(Continued)

OTHER PUBLICATIONS

R. Lauer; "Interferometry by Electron Fourier Holography"; Optik; 67; No. 3; Mar. 5, 1984; pp. 291-293.
(Continued)

*Primary Examiner* — Phillip A Johnston
(74) *Attorney, Agent, or Firm* — Miles & Stockbridge, P.C.

(57) ABSTRACT

The density difference of particle beam irradiation with two optical statuses is produced utilizing a diffraction effect, within the same field of vision, such that a diffraction grating manufactured with a material which passes through a particle beam is provided on the upper side of a specimen and on the lower side of the irradiation optical system. Further, a region wider than the opening region of the diffraction grating is irradiated with the particle beam to produce the density difference of the particle beam emitted to the specimen, by superposing the particle beam, Bragg-diffracted with the opening region, and the particle beam, transmitted through the outer peripheral part of the opening region without being diffracted, with each other, and emitting the beam to the specimen.

10 Claims, 13 Drawing Sheets

(51) Int. Cl.
*G02B 5/18* (2006.01)
*H01J 37/10* (2006.01)
*H01J 37/20* (2006.01)
*H01J 37/244* (2006.01)
*H01J 37/26* (2006.01)

(52) U.S. Cl.
CPC ............ *H01J 37/244* (2013.01); *H01J 37/26* (2013.01); *H01J 37/295* (2013.01); *G01N 2223/315* (2013.01); *G01N 2223/418* (2013.01); *H01J 2237/2482* (2013.01)

(56) References Cited

U.S. PATENT DOCUMENTS

| | | | |
|---|---|---|---|
| 6,617,580 B2* | 9/2003 | Voelkl | H01J 37/26 250/307 |
| 8,680,488 B2 | 3/2014 | McMorran | |
| 10,210,962 B2* | 2/2019 | Harada | G02B 5/1866 |
| 2008/0094710 A1 | 4/2008 | Endoh | |
| 2010/0230591 A1 | 9/2010 | Berriman et al. | |
| 2011/0031395 A1 | 2/2011 | Harada et al. | |
| 2017/0194065 A1 | 7/2017 | Harada et al. | |

FOREIGN PATENT DOCUMENTS

| | | |
|---|---|---|
| JP | 2011-40217 A | 2/2011 |
| WO | 2006115114 A1 | 11/2006 |
| WO | 2015118624 A1 | 8/2015 |

OTHER PUBLICATIONS

International Search Report dated Jun. 27, 2017, in International Application No. PCT/JP2017/014393.

* cited by examiner

PARTICLE BEAM DEVICE, OBSERVATION METHOD, AND DIFFRACTION GRATING

TECHNICAL FIELD

The present invention relates to a particle beam device which utilizes a diffraction effect and its observation method, and a diffraction grating utilized in the particle beam device.

BACKGROUND ART

A charged particle beam such as an electron beam or an ion beam, which is propagated in vacuum, has a short wavelength of several pm digits, and has a small deflection angle. Further, there is no effective beam splitter such as half-mirror used in the field of optics. Accordingly, it is difficult to form plural optical paths and configure respectively independent optical systems as in the case of Mach-Zehnder interferometer in an optical bench. Further, with a short-wavelength electromagnetic wave such as an ultraviolet ray or an X-ray, it is difficult to configure an effective optical element due to its good transparency. Further, in the case of a particle beam such as a neutron beam, a molecular beam, or a heavy particle beam, there is no optical element in the first place. Accordingly, a specimen is provided between a light source and a detector, and observation is performed only on a scattered or absorbed image in the specimen by path propagation, or on a diffraction pattern based on interference or diffraction effect. That is, in any of the above-described electromagnetic wave devices and particle beam devices, a one-path optical system is used. In the system, it is necessary to use the same lens and the same deflector or the like for the transmitted beam which has been transmitted through the specimen and the scattered or diffracted beam, and measurement methods to which the same optical conditions are applied are used.

Among the above-described devices, the development of an electron microscope using an electron beam is most advanced. Various optical elements such as an electron lens, a deflector, an electron beam biprism are realized. In principle, the electron beam is propagated in vacuum, therefore, the elements are merely configured such that a one-path optical system is formed in one vacuum-evacuated barrel. Even upon use of the electron beam biprism which is an only effective beam splitter in electron beam interference, it has a small deflection angle of $10^{-3}$ rad at most. The limitation that the same lens and the same deflector are used for two paths is not different from the other particle beam devices. Accordingly, it is difficult to produce density difference of electron beam irradiation within the same field of vision. It is difficult to observe specimen charging effect and specimen damage degree caused by electron beam irradiation, while simultaneously comparing and referring to two irradiation conditions, and especially, it is difficult to observe the progress of the change.

Although it is not a countermeasure against the above problem, as a Fourier transform holography, a non-patent literature 1 disclosing a technique of producing two irradiation conditions within one barrel, and a patent literature 1 disclosing a possibility of production of two X-ray irradiation conditions are known.

The non-patent literature 1 shows a technique of utilizing a back focal plane of an objective lens for an electron beam transmitted through a diffusing plate of an amorphous thin film as a specimen plane. The technique is utilizing a phenomenon that an electron beam transmitted without being scattered with the diffusing plate is formed in a spot on an optical axis, while an electron beam scattered at random with the amorphous film spreads in a plane on the back focal plane. The interference between the spot on the optical axis and the electron beam on the planate part is utilized. The patent literature 1 discloses utilizing a zone plate with a hole, in place of the diffusing plate in the non-patent literature 1. The focal point by the lens effect of the zone plate becomes a spot, and the X-ray transmitted through the hole becomes a plane wave. The both examples are not practical as a holography and not popular. Further, it is not possible to realize these techniques in a particle beam device without lens.

Further, the patent literatures 2 and 3 disclose providing an edge dislocation grating (fork grating) as a diffraction grating provided on the upper side of the specimen. According to the patent literature 2, only a diffracted electron beam, which has passed through the edge dislocation grating and has become a spiral wave in reciprocal space, is emitted to the specimen. An electron lens and a throttle hole are provided between the edge dislocation grating and the specimen, and the specimen is provided in the back focal position. It is impossible to realize this example in the case of a particle beam device without lens.

CITATION LIST

Patent Literature

PTL 1: PCT International Publication No. WO2006/115114
PTL 2: U.S. Pat. No. 8,680,488
PTL 3: PCT International Publication No. WO2015/118624

Non-Patent Literature

NPTL 1: R. Lauer; Optik, 67 (1984) 291.

SUMMARY OF INVENTION

Technical Problem

As described above, in the electromagnetic wave devices to handle a short wavelength such as an ultraviolet ray or an X-ray and in the particle beam devices, only a one-path optical system is utilized, i.e., only a measurement method, applying the same optical conditions such as the same lens and the same deflector to the beam transmitted through the specimen and the scattered or diffracted beam, is utilized. Accordingly, it is difficult to produce density difference of particle beam irradiation with two optical statuses within the same field of vision. It is difficult to perform high-magnification observation by irradiating in a wide range while locally increasing irradiation amount to increase brightness, or to perform observation on the change of dose dependency in the local specimen status by referring to its peripheral part. Otherwise, in processing or the like, it is difficult to perform pin-point local high-density irradiation while performing entire constant small-amount irradiation so as to perform processing or adjustment.

For example, to observe the charging effect of the specimen upon electron beam irradiation, an insulator is provided in a part of the specimen which is not charged, and a charge-up phenomenon upon observation in the insulator by the irradiated electron beam is observed. Otherwise, the electron beam is narrowed in spot shape, to raise the current density, and a part of the specimen is irradiated with the electron beam. Then the irradiation region is widened, and the status of change of charging in the spot-irradiated part is observed later. That is, there has been no technique to observe direct irradiation effects introduced with the electron beam in an equilibrium state. It has been regarded as an unavoidable inconvenience since the same electron beam is used as observation means and introduction means of charging phenomenon.

The object of the present invention is to solve the above-described problems, and to provide a particle beam device capable of producing density difference of particle beam irradiation with two optical statuses within the same field of vision, its observation method, and a diffraction grating.

Solution to Problem

To attain the above-described object, the present invention provides a particle beam device comprising: a particle beam source that generates a particle beam; an irradiation unit that emits the particle beam to a specimen; a specimen holder that holds the specimen; a detection unit that detects the particle beam transmitted through the specimen; a diffraction grating, provided on the upstream side in a traveling direction of the particle beam in the specimen, and on the downstream side in the traveling direction of the particle beam in the irradiation unit, that is configured with a material having transparency with respect to the particle beam; and a holding device that enables attachment/removal and movement of the diffraction grating with respect to an optical axis of the particle beam device, wherein an opening region of the diffraction grating is smaller than an irradiation region of the particle beam to the diffraction grating.

Further, to attain the above-described object, the present invention provides: an observation method with a charged particle beam device, wherein the charged particle beam device comprises: a light source that generates a charged particle beam; an irradiation unit that emits the charged particle beam to a specimen; a specimen holder that holds the specimen; an objective lens system having at least one lens for imaging the charged particle beam transmitted through the specimen; an imaging optical system having a plurality of lenses provided on the downstream side in a traveling direction of the charged particle beam in the objective lens system; and a diffraction grating, provided on the upstream side in the traveling direction of the charged particle beam in the specimen, and on the downstream side in the traveling direction of the charged particle beam in the irradiation unit, that is configured with a material having transparency with respect to the charged particle beam, and wherein an opening region of the diffraction grating is smaller than an irradiation region of the charged particle beam to the diffraction grating, and observation is performed on a status where the irradiation region of the charged particle beam, diffracted with the diffraction grating formed on the specimen, is within the irradiation region of the charged particle beam transmitted through the diffraction grating.

Further, to attain the above-described object, the present invention provides: a diffraction grating used in a particle beam device, which is formed with a material having transparency with respect to a particle beam, and which has an opening region to diffract the particle beam and an outer peripheral part of the opening region, wherein when the particle beam is emitted to the opening region and the outer peripheral part, density difference are produced in the particle beam emitted to a specimen, provided on the downstream side in a flowing direction of the particle beam.

Advantageous Effects of Invention

According to the present invention, it is possible to perform observation on the influence of irradiation of the specimen with the particle beam, superimposed or reduced by diffraction, with reference to an irradiation amount with the particle beam transmitted without diffraction with the diffraction grating, together with the status of the peripheral part.

DESCRIPTION OF EMBODIMENTS

Figure 1:
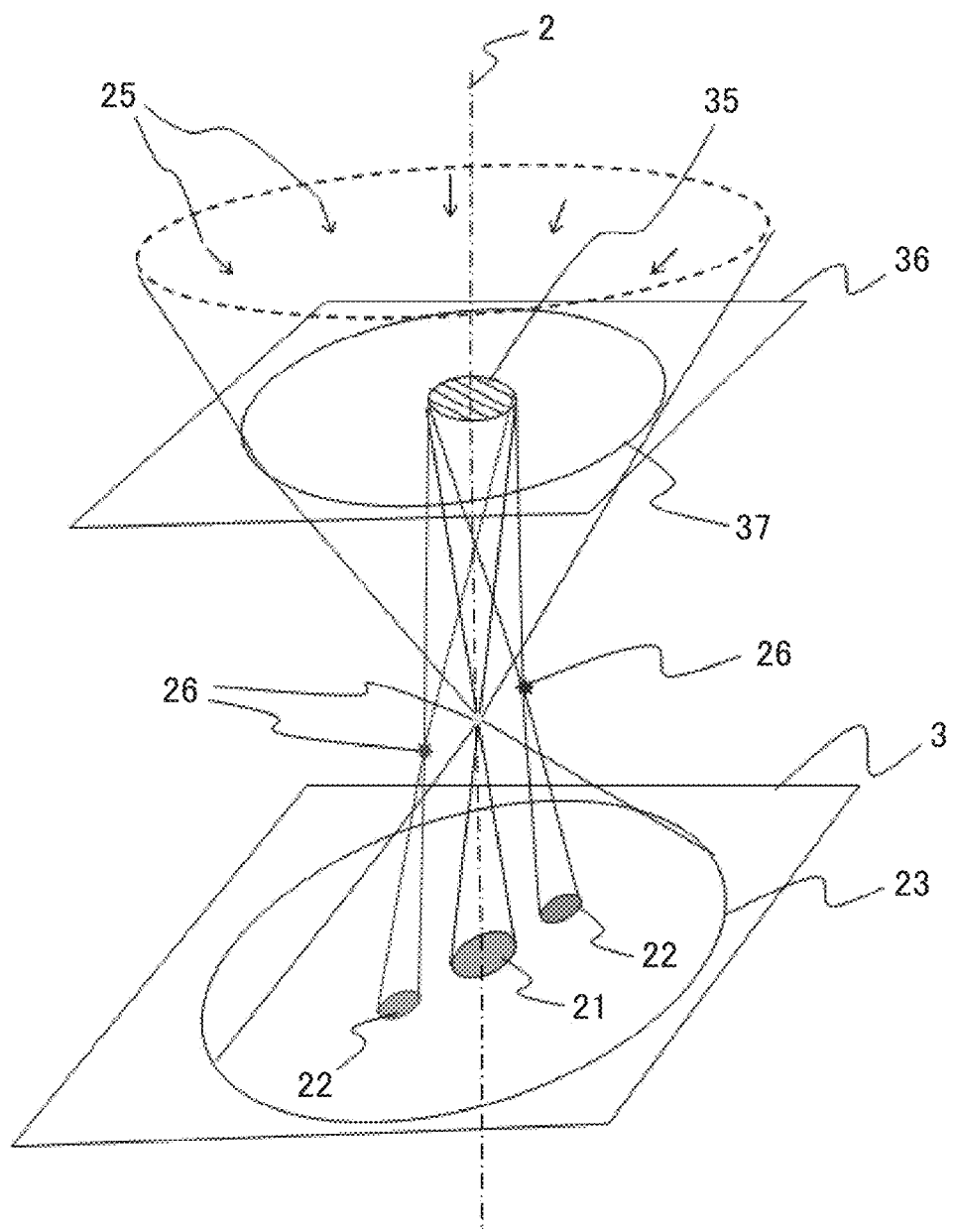
FIG. 1 is a schematic diagram showing a basic configuration of an optical system according to the present invention.

Hereinbelow, prior to explanation of embodiments of the present invention, the principle technique of the present invention will be briefly described. A diffraction grating configured on a substrate having transparency with respect to a particle beam such as an electron beam is provided on the upper side of a specimen placed on a specimen plane and the lower side of an irradiation optical system. Then, when an irradiation region wider than an opening region of the diffraction grating is irradiated with the particle beam, as an irradiation beam Bragg-diffracted with the diffraction grating and a transmitted beam which has not been diffracted are superimposed and emitted to the specimen. Thus it is possible to produce density difference of the irradiation beam to the specimen.

At this time, it is possible to control an irradiation position of the superpose-irradiation on the specimen plane by positional change of the diffraction grating in an optical-axis vertical direction. When the irradiation beam is converge-emitted or diffuse-emitted, it is possible to control the irradiation spot size of the superpose-irradiation on the specimen plane by positional change of the diffraction grating in the optical axis direction. Since this technique is only based on the Bragg diffraction, as long as the particle beam has interference characteristic to cause Bragg diffraction, the technique is implemented in the case of a molecular beam, a heavy particle beam, or a neutron beam, in addition to an electromagnetic wave such as an X-ray or a charged particle beam such as an electron beam or an ion beam.

According to the above-described technique, it is possible to perform superpose-addition of a diffracted beam, diffracted with the diffraction grating, within the irradiation region, with reference to an irradiation amount with the transmitted beam transmitted through an opening outer peripheral part of the diffraction grating without diffraction in the opening region of the diffraction grating. Further, in a shadow part of the opening region of the diffraction grating, since the irradiation beam is reduced by use as the diffracted beam, it is possible to perform simultaneous observation even when the irradiation beam is reduced from the reference irradiation amount. That is, it is possible to observe the influence of irradiation of the specimen with the superposed or reduced particle beam, together with the status of the peripheral part.

Further, it is possible to perform interference observation on the superposition-irradiation position with the diffracted beam, while referring to the peripheral part uniformly irradiated with the transmitted beam. It is possible to measure only the effect by the local irradiation of the specimen with the particle beam. At this time, it is possible to cross the diffraction direction of the diffracted beam and the interference direction to cause superposition interference of the two waves. It is possible to avoid contribution of the influence of the superposed diffracted beam to the interference, and to perform high-precision measurement. Further, it is possible to control the coherence of the irradiation beam with a diffraction angle of irradiation of the diffraction grating and a diffraction angle of the grating, and a distance between the grating and the specimen. That is, the optical system according to the present invention also has high freedom and controllability in interference measurement.

In the following description of the specification and the claims, a "particle beam device" generally means, in addition to a particle beam device for a neutron beam, a particle beam such as a molecular beam or a heavy particle beam, a device which uses a charged particle beam such as an electron beam or an ion beam, and further, a device which uses an electromagnetic wave such as an X-ray, an ultraviolet ray, or a gamma ray. Further, a beam having interference characteristic to cause Bragg diffraction with wave motion, including a charged particle beam such as an electron beam or an ion beam, a molecular beam or a heavy particle beam, or a neutron bean, and further, an electromagnetic wave such as an X-ray, will be generally referred to as a particle beam. Further, a "diffraction grating" means an element including an opening region to diffract the particle beam and an outer peripheral part of the opening region, i.e., the diffraction grating as an object.

Example 1

An example 1 is an example of a particle beam device utilizing a diffraction effect and its observation method, and a diffraction grating used in the particle beam device. That is, it is an example of a particle beam device comprising: a particle beam source that generates a particle beam; an irradiation unit that emits the particle beam to a specimen; a specimen holder that holds the specimen; a detection unit that detects the particle beam transmitted through the specimen; a diffraction grating, provided on the upstream side in a traveling direction of the particle beam in the specimen, and on the downstream side in the traveling direction of the particle beam in the irradiation unit, that is configured with a material having transparency with respect to the particle beam; and a holding device that enables attachment/removal and movement of the diffraction grating with respect to an optical axis of the particle beam device, wherein an opening region of the diffraction grating is smaller than an irradiation region of the particle beam to the diffraction grating.

Further, it is an example of an observation method with a charged particle beam device, wherein the charged particle beam device comprises: a light source that generates a charged particle beam; an irradiation unit that emits the charged particle beam to a specimen; a specimen holder that holds the specimen; an objective lens system having at least one lens for imaging the charged particle beam transmitted through the specimen; an imaging optical system having a plurality of lenses provided on the downstream side in a traveling direction of the charged particle beam in the objective lens system; and a diffraction grating, provided on the upstream side in the traveling direction of the charged particle beam in the specimen, and on the downstream side in the traveling direction of the charged particle beam in the irradiation unit, that is configured with a material having transparency with respect to the charged particle beam, and wherein an opening region of the diffraction grating is smaller than an irradiation region of the charged particle beam to the diffraction grating, and observation is performed on a status where the irradiation region of the charged particle beam, diffracted with the diffraction grating formed on the specimen, is within the irradiation region of the charged particle beam transmitted through the diffraction grating.

FIG. 1 shows a basic configuration of the present invention and the most basic configuration of the particle beam device according to the example 1. In the particle beam device, a diffraction grating 36 having an opening region 35 is provided on the upstream side from a specimen or a specimen plane 3. The specimen or the specimen plane 3 is irradiated independently with a transmission wave 21 transmitted through the opening region 35 of the diffraction grating 36 and a diffracted diffraction wave 22. The diffraction grating 36 is formed with a substrate made of a material having transparency with respect to an employed particle beam 25. A region 37 where the diffraction grating 36 is irradiated with the particle beam 25 is larger than the opening size of the opening region 35. Further, the particle beam 25 is adjusted such that an irradiation region 23 where the specimen or the specimen plane 3 is irradiated with the particle beam 25 transmitted through the diffraction grating 36 is larger than the position of irradiation with the diffraction wave 22 diffracted with the diffraction grating and its region.

With this configuration, regarding the particle beam 25 emitted on the specimen or the specimen plane 3, in a region including an optical axis 2 of the particle beam device, irradiated with the transmission wave 21 as the particle beam transmitted through the opening region 35, the intensity of the particle beam is reduced in comparison with the peripheral part by the diffraction effect with the opening region 35. Further, as the particle beam on the specimen or the specimen plane 3, irradiated with the diffraction wave 22 diffracted with the opening region 35, is a beam synthesized from the transmission wave transmitted through the outer peripheral part of the opening region 35 corresponding to the region 37 and the diffraction wave 22. Accordingly, the intensity is more increased than that in the peripheral part.

In this manner, it is configured such that the diffraction grating 36 formed with the substrate of the material having transparency with respect to a particle beam is used, and its opening region 35 is smaller than the irradiation region 37 of the particle beam emitted to the substrate. Accordingly, density difference are formed on the specimen plane by superposition of the transmitted particle beam corresponding to the irradiation region 37 including the outer peripheral part of the opening region 35 of the diffraction grating 36, a diffraction spot of the irradiation particle beam diffracted with the opening region 35 of the diffraction grating 36 formed on the substrate having transparency, and the shadow of the diffraction grating.

According to the configuration of the present example, with reference to the intensity of the incident wave transmitted through the diffraction grating, emitted on the specimen plane, the opening region of the diffraction grating on the optical axis of the device becomes a shadow region of the diffraction grating, in which the particle beam intensity is reduced. On the specimen plane where the diffraction wave has arrived, the intensity of the particle beam is increased by the superposition of the transmission wave and the diffraction wave. In this manner, by providing the diffraction grating on the upstream side of the specimen plane with respect to the particle beam, it is possible to simultaneously produce three irradiation intensities within the same field of vision.

In the basic configuration in FIG. 1, the diffraction grating 36 and the specimen 3 are mutually independent, and are respectively set on a holder slightly movable in horizontal two-dimensional directions and vertical direction. It is possible to determine an observation position for the specimen as in the case of the conventional particle beam devices. Further, by slightly moving the position of the diffraction grating, it is possible to superpose the diffraction wave in an arbitrary position of the specimen, or to superpose the shadow region of the opening of the diffraction grating. When the holders of one or both of the diffraction grating and the specimen have an azimuth angle rotation mechanism with an axis parallel to the optical axis as a rotation axis, the freedom is further increased with respect to the observation position for the specimen 3 and the superposition-irradiation position of the diffraction wave to the specimen.

Further, when it is configured such that the respective holders of the diffraction grating and the specimen are independently attachable/removable to/from the optical axis of the device in the optical system, in a case where, e.g., the diffraction grating is removed from the optical axis of the optical system, it is possible as a conventional particle beam device to perform specimen observation. Further, as a procedure to perform the observation method using the configuration according to the present example, it is possible to provide only the diffraction grating in the optical system before the specimen is placed in the optical system, so as to adjust the status of the superposition of the diffraction wave. This procedure is effective for reduction of irradiation amount of the particle beam emitted to the specimen.

Note that the basic configuration of the irradiation optical system in FIG. 1 is illustration of a case where a cross over 26 of the particle beam is formed between the diffraction grating 36 and the specimen or the specimen plane 3. This configuration is preferably applicable to a device where the irradiation optical system of the particle beam device generates a converged beam, i.e., a charged particle beam device such as an electron beam device or an ion beam device.

Hereinbelow, the position of the cross over 26 in the particle beam device according to the present example will be described. Generally, as the position of the cross over 26, three positions are considered. That is, it is positioned on the upper side of the diffraction grating 36 as shown in FIG. 2(*a*); it is positioned between the diffraction grating 36 and the specimen 3 as shown in FIG. 2(*b*) and FIG. 1; or it is positioned on the lower side of the specimen or the specimen plane 3 as shown in FIG. 2(*c*).

Figure 2:
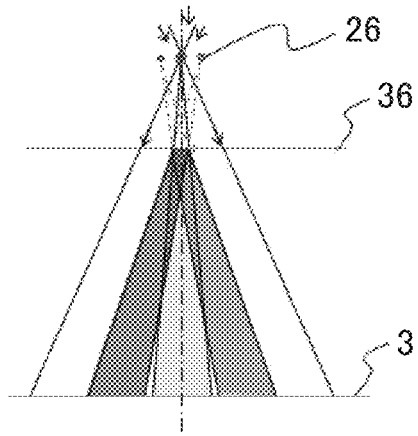
FIGS. 2(a) to 2(c) are schematic diagrams showing the positional relationship among a diffraction grating of the optical system, a specimen, and a convergent point (crossover), according to the present invention.
Figure 2:
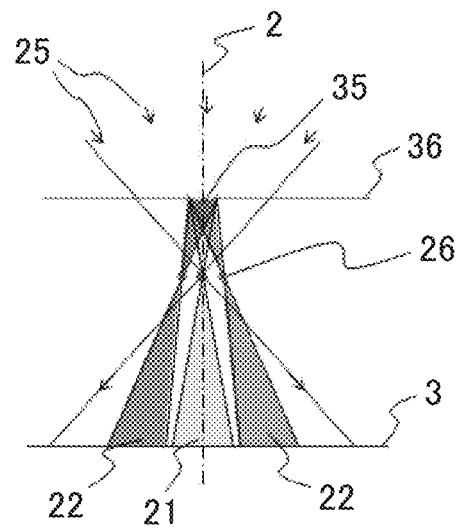
Figure 2:
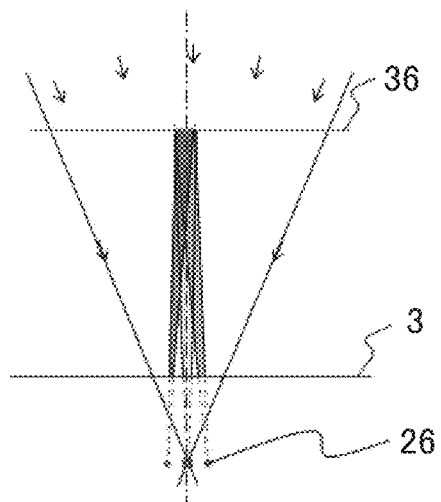

The irradiation optical system shown in FIG. 2(*a*) is an irradiation optical system sufficient for convergence or divergence of a particle beam such as an X-ray, a neutron beam, or a molecular beam, used as a probe, or an essential optical system for a particle beam device without imaging optical system for specimen observation. It goes without saying that it is an optical system which can be implemented in an electron beam device or an ion beam device. It is an optical system effective when the reference irradiation region of irradiation with the transmission wave 21, the region of superposition irradiation with the diffraction wave 22, and the shadow region of the opening region 35, on the specimen or the specimen plane 3, are respectively wide.

The irradiation optical system shown in FIG. 2(*b*) is an optical system to once form the cross over 26 between the diffraction grating 36 and the specimen or the specimen plane 3, to make the respective transmission wave 21 and diffraction wave 22 spots. It is effective to form the region of superposition irradiation and the shadow region of the opening of the diffraction grating, with a diffraction wave, relatively small with respect to the reference irradiation region by irradiation with the transmission wave on the specimen plane. Further, the irradiation optical system shown in FIG. 2(*c*) is an optical system as a counterpart of the irradiation optical system shown in FIG. 2(*a*). It is an optical system effective when the reference irradiation region irradiated with the transmission wave, the region of superposition irradiation with the diffraction wave, and the shadow region of the opening of the diffraction grating, on the specimen or the specimen plane 3, are respectively narrow range.

It is possible to easily select one of the three optical systems shown in FIGS. 2(*a*) to 2(*c*), i.e., the positional relationships among the cross over 26, the diffraction grating 36 and the specimen 3, in accordance with necessity, in a charged particle beam device having an effective lens system. In the X-ray device and the neutron beam device, the lens system is designed although it is weak, accordingly, as long as the path length of the particle beam is sufficiently long, it is possible to realize the respective three optical systems in principle.

Figure 3:
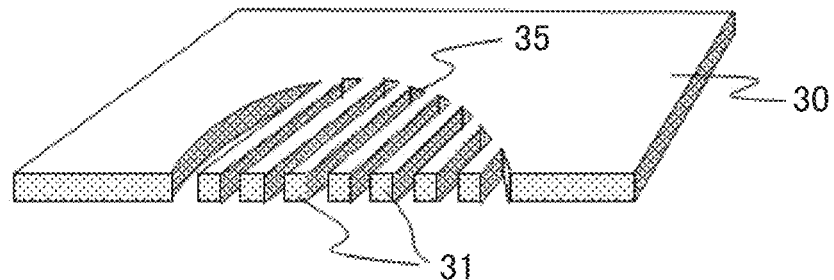
FIGS. 3(a) to 3(d) are schematic diagrams illustrating a cross section of a grating explaining the diffraction grating according to an example 1.
Figure 3:
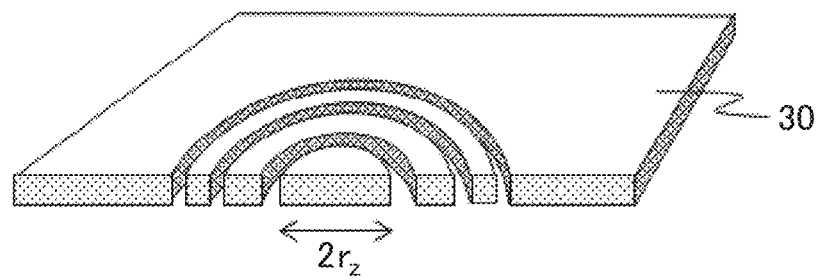
Figure 3:
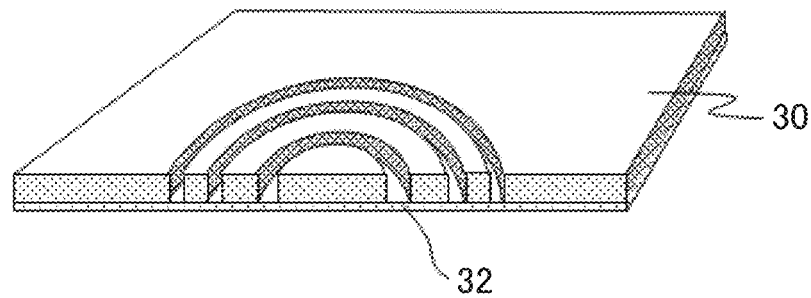
Figure 3:
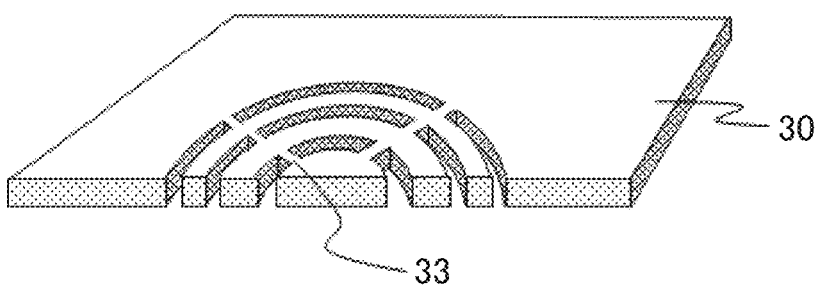

FIGS. 3(*a*) to 3(*c*) are half cross-sectional diagrams showing an example of the configuration of the diffraction grating used in the particle beam device and the observation method according to the present example. As described above, the diffraction grating is configured with a substrate 30 made of a material having transparency with respect to the employed particle beam. FIG. 3(a) shows a straight grating which is configured on the substrate 30 and which has a grating stem 31; FIG. 3(b), a zone plate configured on the substrate 30; FIG. 3(c), a zone plate which is configured on the substrate 30, and in which a thin film 32 to hold an inner ring is added to a lower part of the grating; and FIG. 3(d), a zone plate of a type to hold the inner ring with a reinforcing bridge 33. When the grating part configured on the substrate 30 has a pattern shape independent of the opening outer peripheral part as in the case of the zone plate, it is necessary to hold or reinforce the grating part as shown in FIG. 3(c) or FIG. 3(d). The thin film 32 is configured with a material having transparency with respect to the particle beam emitted to the diffraction grating. Note that FIG. 3 illustrates the cases of round openings, however, the configuration of the present example is not limited to the round opening.

The straight grating in FIG. 3(a) will be described as an example. FIG. 3(a) illustrates the diffraction grating 36 such that the width of the stem 31 and the width of the space as a gap between the stems 31 are the same, and further, the stem 31 has a rectangular shape. As the stem 31 has a rectangular shape, it is possible to generate a high-order diffraction wave as a harmonic wave. It is possible to control the intensity of the high-order diffraction wave with the ratio between the width of the stem 31 and the width of the space as the gap between the stems 31. For example, when the ratio between the width of the stem 31 and the width of the space as the gap between the stems 31 is 1:1, it is possible to weaken the intensity of the secondary diffraction wave. When the ratio between the width of the stem 31 and the width of the space as the gap between the stems 31 is 2:1 or 1:2, it is possible to weaken the intensity of the tertiary diffraction wave. Further, when the shape of the stem 31 is changed to a sine-function like shape, it is possible to suppress the occurrence of harmonic diffraction wave, and it is possible to increase the intensity of the ±primary diffraction wave.

As shown in FIG. 1 and FIGS. 2(a) to 2(c), in the configuration according to the present example, the particle beam transmitted through the opening region of the diffraction grating, i.e., the substrate 30 of the outer peripheral part of the opening, is the reference for irradiation intensity. Accordingly, in the substrate 30 forming the diffraction grating 36, the transparency with respect to the particle beam is not necessarily 100%, however, it is necessary to limit the substrate to have a thickness to transmit the incident particle beam with sufficient intensity. Further, the incident particle beam does not necessarily have interference characteristic except a case where an interference optical system to be described in the examples is used. However, for imaging with the particle beam transmitted through the diffraction grating and the specimen on the downstream side of the diffraction grating, it is necessary to suppress energy dissipation of the incident particle beam due to deterioration of the interference characteristic and inelastic scattering. As a judgment criteria, e.g., it is possible to use a condition that the phase modulation of the electron beam at 300 kV transmitted through the substrate forming the diffraction grating or the material of the thin film is about IC or lower.

Table 1 shows an example of the thickness of the substrate to apply the phase difference IC to the 300 kV electron beam regarding several substrates or thin film materials. Among them, utilization of a silicon nitride (Si₃N₄) film having a thickness of 30 nm or 50 nm is appropriate since the material is commercially available and it is easily processed. At this time, as the Si₃N₄ film has insulation, when a charged particle beam such as an electron beam is used as the particle beam, it is necessary to add a charging prevention countermeasure by carbon (C) shadowing, platinum palladium (PtPd) coating or the like.

TABLE 1

| Material | Thickness (nm) |
|---|---|
| C | 61.4 |
| Al | 38.6 |
| Si | 40.3 |
| Cu | 20.4 |
| Au | 22.3 |
| MgO | 35.5 |
| Si₃N₄ (amorphous) | 46.9 |
| SiO₂ (amorphous) | 47.4 |

FIGS. 4(a) to 4(d) show several types of diffraction gratings available in the particle beam device according to the present example. The diffraction grating is drawn in a thin color so as to indicate that the substrate or thin film constructing the above-described diffraction grating has transparency with respect to the employed particle beam. FIG. 4(a) shows a straight grating 43; FIG. 4(b), a zone plate 44; FIG. 4(c), an edge dislocation grating 45; and FIG. 4(d), a spiral zone plate 46. FIGS. 4(a) and 4(b) show the diffraction grating of the same type as shown in FIGS. 3(a) and 3(b); and FIGS. 4(c) and 4(d), a diffraction grating to generate a spiral wave. The spiral wave has a spiral-shaped equiphase plane, and has a singularity that the phase is not uniquely determined in the spiral core part. It is considered that it is possible to transmit the spiral wave while holding orbital angular momentum. For example, in the case of an electron beam, there is a possibility that the beam becomes a probe with a magnetic field in the propagation direction (see patent literature 3).

Figure 4:
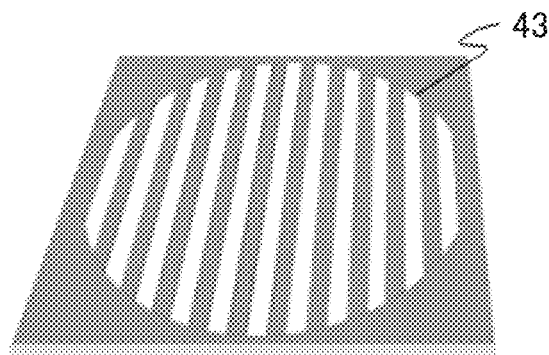
FIGS. 4(a) to 4(d) are schematic diagrams showing an example of the configuration of the diffraction grating according to the example 1.
Figure 4:
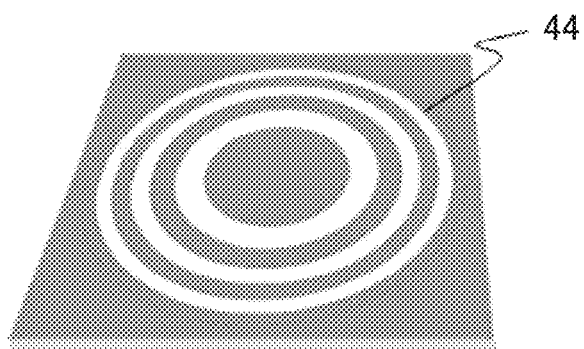
Figure 4:
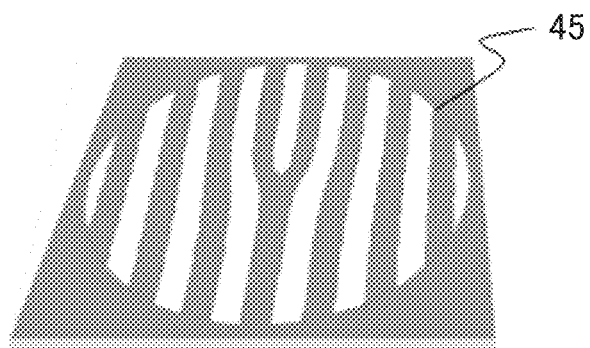
Figure 4:
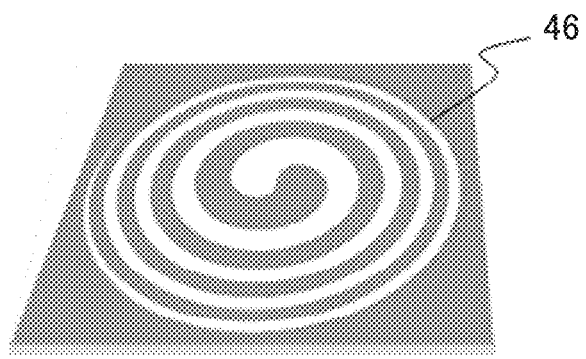

When the incident particle beam is transmitted through the edge dislocation grating 45 drawn in FIG. 4(c), a spiral-shaped plane wave is generated as a diffraction wave with an edge dislocation part at the center of the grating as an axis. Further, in the spiral zone plate 46 in FIG. 4(d), a spherical wave type spiral wave is generated with the edge dislocation part at the center of the grating as an axis. It goes without saying that the diffraction grating in FIGS. 4(c) and 4(d) has a characteristic as a diffraction grating, accordingly, it is possible to control the harmonic wave of the diffraction wave with the aforementioned radio between the width of the stem of the grating and the width of the space as the gap between the stems and the shape of the stem of the grating. Note that in the example shown in FIG. 4, the opening is drawn as a round opening, however, the opening as the opening region of the diffraction grating according to the present example is not limited to the round opening.

Figure 5:
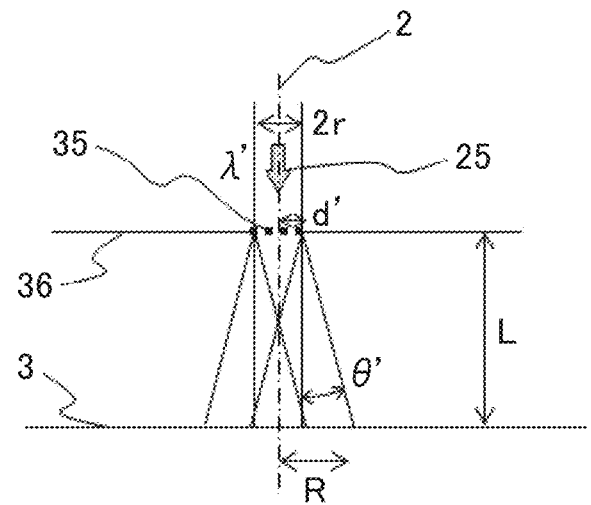
FIGS. 5(a) and 5(b) are schematic diagrams explaining Bragg diffraction and Fraunhofer diffraction, according to the example 1.
Figure 5:
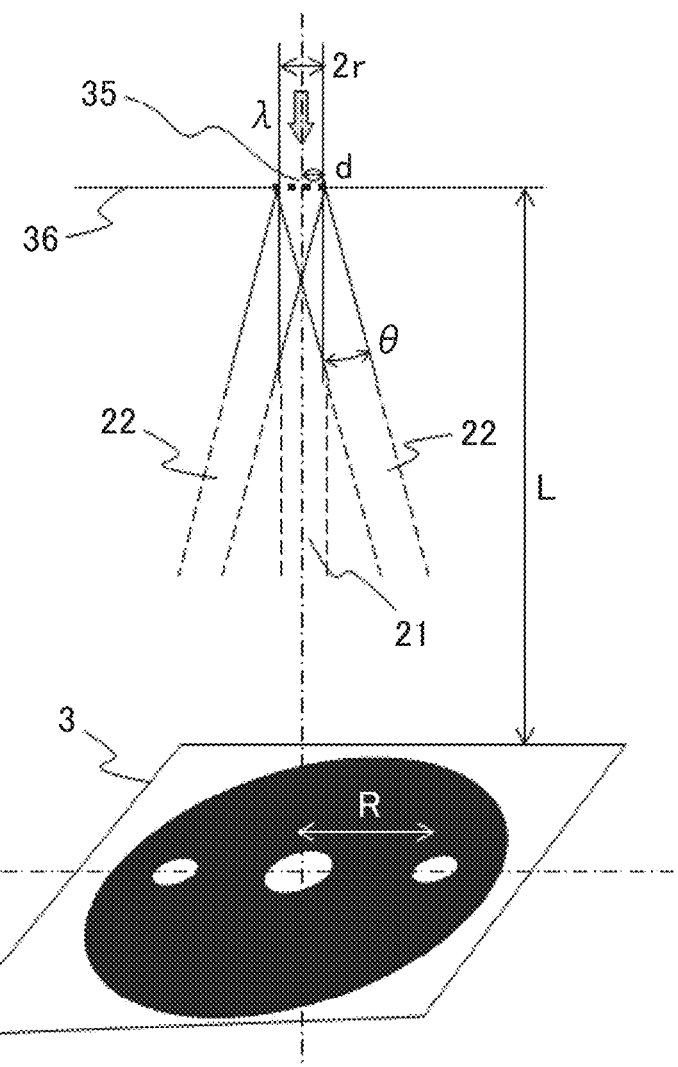

Next, using FIG. 5, the Bragg diffraction with the diffraction grating and application conditions of the diffraction grating utilized in the device configuration according to the present example will be described. Note that upon introduction of numerical expressions, a round opening having a diameter of 2r will be described for the sake of simplicity. Assuming that 2r is the maximum size of the opening, other opening shapes can be similarly handled. Further, for the sake of simplicity, it is assumed that a collimated beam is used as the incident particle beam.

The Bragg diffraction is a phenomenon that upon transmission or reflection of the wave motion incident with respect to an object having a periodic structure, the intensity is increased at a particular angle. It was found as a phenomenon in an X-ray with respect to a crystal. This phenomenon occurs when the X-rays scattered with atoms constructing the crystal are intensified or cancelled with each other with the periodic structure of the crystal. Assuming that the wavelength of the X-ray is λ', the interval between crystal planes is d', the angle between the crystal plane and the X-ray is θ', and n, an integer, the Bragg condition is represented with an expression (1).

[Expression 1]

$$2d'\sin\theta' = n\lambda' \quad (1)$$

FIG. 5(a) shows the Bragg relationship in the diffraction grating. Assuming that the grading interval of the diffraction grating is d, the wavelength of the incident particle beam is λ, the diffraction angle is θ, and n is an integer, the Bragg condition is represented with an expression (2).

[Expression 2]

$$d\sin\theta \approx d\theta = n\lambda \quad (2)$$

In the expression (2), assuming that the diffraction angle θ is a small angle, paraxial approximation is performed. As particle beam diffraction, it is handled in the configuration according to the present example without loss of generality. Further, as the ±primary diffraction wave is mainly handled, n=1 holds. Further, when the diffraction phenomenon is observed with the particle beam device, assuming that the distance between the specimen and the detection plane is L, and the distance between the transmission wave and the diffraction wave on the detection plane is R, the Bragg condition is simplified with an expression (3).

[Expression 3]

$$\theta = \frac{\lambda}{d} = \frac{R}{L} \quad (3)$$

Next, the application condition of the diffraction grating utilized in the device configuration according to the present example will be described. As shown in FIG. 5(b), the distance L between the above-described diffraction grating and the detection plane is replaced as a distance L between the position where the diffraction grating 36 is provided and the position of the specimen or the specimen plane 3 as the object of particle beam irradiation. As an application condition of the configuration according to the present example, the distance L between the diffraction grating 36 and the specimen or the specimen plane 3 is one parameter for determination of implementation/non-implementation. As a relationship between the transmission wave and the diffraction wave when the diffraction grating is irradiated with a parallel irradiation wave, it is necessary to satisfy the following two conditions.

(i) The transmission wave and the diffraction wave are not superposed on the specimen plane.
(ii) The transmission wave does not become a point image (the condition of the Fraunhofer diffraction is not satisfied).

The condition (i) means that when a region equal to or wider than the maximum width of the opening region of the diffraction grating is irradiated with the particle beam, the shadow region of the diffraction grating formed with the particle beam transmitted through the diffraction grating and the particle beam diffracted with the diffraction grating do not superpose with each other on the specimen.

From the condition (i), as a condition that after the propagation of the diffraction wave at the diffraction angle θ by the distance L, the region of the diffraction wave and the shadow region of the grating formed with the transmission wave do not superpose with each other, an expression (4) is derived.

[Expression 4]

$$2rd < L\lambda \quad (4)$$

That is, it means that the product between the grating interval of the diffraction grating and the maximum width of the opening region of the diffraction grating is smaller than the product between the wavelength of the particle beam and the distance between the specimen and the diffraction grating provided on the upstream side in the particle-beam flowing direction in the specimen.

Further, in the condition (ii), as an expression (5) as a Fraunhofer diffraction condition is not satisfied, then an expression (6) is obtained.

[Expression 5]

$$L \gg \frac{r^2}{\lambda} \quad (5)$$

[Expression 6]

$$L\lambda < r^2 \quad (6)$$

That is, the configuration according to the present example is realized when the parameters (d, r) of the diffraction grating and the parameters (L, λ) of the particle beam device satisfy an expression (7).

[Expression 7]

$$2rd < L\lambda < r^2 \quad (7)$$

The application condition explained in the expression (7) is the condition when the straight grating 43 shown in FIG. 3(a) and FIG. 4(a) is used. Here the case of the zone plate 44 shown in FIGS. 3(b), 3(c), 3(d) and FIG. 4(b) will be described. The zone plate 44 has a converging effect as in the case of a lens. Its focal length f is represented as the radius of the zone plate at its center, i.e., the radius of an innermost ring-shaped zone $r_z$, with an expression (8).

[Expression 8]

$$f = \frac{r_z^2}{\lambda} \quad (8)$$

In the case of the zone plate, as the particle beam incident in parallel with the opening is converged to a point image with the focal length, the converged size is smaller than the half of the opening size when the distance L between the diffraction grating and the specimen is longer than the half of the focal length f of the zone plate (L>f/2). In other words, when a region equal to or wider than the maximum width of the opening region of the zone plate is irradiated with the particle beam, the converged size of the particle beam transmitted through the zone plate is smaller than the half of the maximum width of the opening region. With this configuration, an expression (9) is obtained.

[Expression 9]

$$\frac{r_z^2}{\lambda} < L\lambda < r^2 \quad (9)$$

According to this zone plate, when a region equal to or wider than the maximum width of the opening region of the zone plate is irradiated with the particle beam, the particle beam transmitted through the zone plate is focused on the specimen.

Note that regarding the transmittance of the zone plate, it is known that when the zone plate is formed with a material having transmittance not 0%, i.e. a material having transparency, the intensity of the converged beam is increased. Especially, when λ phase change is applied to the particle beam transmitting through the innermost ring-shaped zone at the center of the zone plate, the intensity of the converged beam becomes maximum, and about 40% intensity increment is obtained. Accordingly, in the zone plate, the material shown in Table 1 and thickness of the film at that time are also effective.

Figure 6:
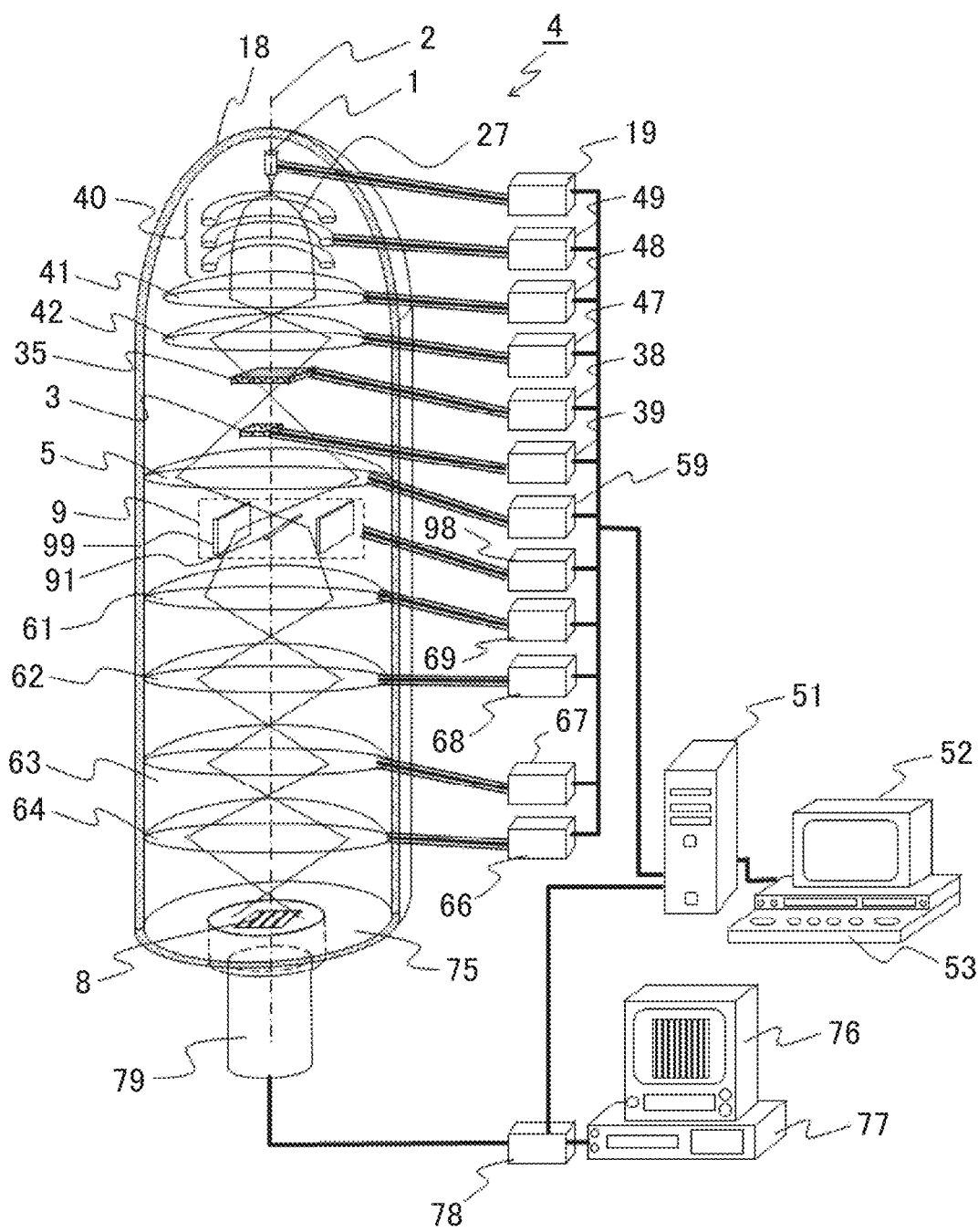
FIG. 6 is a schematic diagram showing an example of the entire system of a particle beam device according to the example 1.

FIG. 6 shows a schematic diagram of an example of the entire system configuration of the particle beam device according to the present example. It is assumed that the device in FIG. 6 is a charged particle beam device 4 and it is a general-purpose electron microscope having about 100 kV to 300 kV accelerating voltage. Accordingly, it has the irradiation optical system on the upper side of the specimen, i.e., on the upstream side in the particle-beam flowing direction, and has the imaging optical system on the lower side of the specimen, i.e., on the downstream side in the particle-beam flowing direction. Further, for development to an interference optical system to be described in detail in an example 6, the entire system having a biprism device is schematically drawn.

The configuration of an interference type electron microscope is given in the present example as a charged particle beam device, since among the particle beam devices, development of the interference type electron microscope is advanced as a most complicated system, and in addition, the device also has a versatility in utilization technique of the device. For example, in the system of the charged particle beam device 4 in FIG. 6, when all the lenses of the irradiation optical system are turned off, the electron beam from the particle source is directly emitted to the specimen. When the imaging optical system is also turned off, the device becomes a most simple electron diffraction apparatus. That is, it is possible to configure the device as a form to simulate a neutron beam device, a heavy particle beam, and an X-ray device. Note that the application of the present example is not limited to the interference type electron microscope having the configuration in FIG. 6.

In FIG. 6, an electron gun 1 as a particle source is positioned in the uppermost-stream part in the electron-beam flowing direction, then under the control of a control unit 19 of the particle beam and a control unit 49 of an accelerating tube, the emitted electron beam is accelerated to a predetermined speed with the accelerating tube 40, then, through condenser lenses 41 and 42 of the irradiation optical system controlled with control units 47 and 48, adjusted to have predetermined intensity and an irradiation region, and emitted to the diffraction grating 36 above the specimen. Then the transmission wave and the diffraction wave transmitted through the illustration-omitted diffraction grating 36 are emitted to the specimen 3. The electron beam transmitted through the specimen 3 is imaged with an objective lens 5 controlled with a control unit 59. This imaging operation is followed with imaging lens systems 61, 62, 63, and 64 controlled with control units 69, 68, 67, and 66 at later stages from the objective lens 5, and finally a final image 8 is formed on an observation recording plane 75 of the electron beam device. The image is observed, e.g. on a screen of an image data monitor 76, or stored as image data into an image data recording device 77, through an image detector 79 such as a CCD camera and an image data controller 78.

The transmission wave and the diffraction wave transmitted through the diffraction grating 36 are emitted without optical system to the specimen 3. It is possible to arbitrarily select the position of the cross over as the position of a light source image with the irradiation optical system. FIG. 6 illustrates the case shown in FIG. 2(b), i.e., the cross over is positioned between the diffraction grating and the specimen.

Further, a biprism device 9 controlled with a control unit 98 is drawn based on the most basic electron beam interference optical system provided on the lower side of the objective lens 5 and on the upper side of a first imaging lens 61. It goes without saying that the position of the biprism device 9 is not limited to the position between the objective lens 5 and the first imaging lens 61. The interference part of the electron beam with the biprism device 9, i.e., a superposition part, is enlarged together with the image of the specimen with the imaging lens systems 61, 62, 63, and 64 at later stages from the objective lens, and imaged on the observation recording plane 75. In other words, it is possible to provide one or both of the objective lens system and the imaging optical system with the biprism device.

These devices are entirely systematized, and an operator checks a device control status on the screen of a monitor 52, and via an interface 53, various programs are executed. By using a system control computer 51 which functions as a control unit to control control units such as a control unit 38 for the diffraction grating 36, a control unit 39 for the specimen 3, a control unit 47 for a second irradiation lens 42, a control unit 48 for a first irradiation lens 41, a control unit 49 for the accelerating tube 40, the control unit 59 for the objective lens 5, a control unit 66 for the fourth imaging lens 64, a control unit 67 for the third imaging lens 63, a control unit 68 for the second imaging lens 62, a control unit 69 for the first imaging lens 61, a control unit 78 for the image detector 79, the control unit 98 for the biprism device 9, it is possible to control the electron gun 1, the accelerating tube 40, the respective lenses, the specimen 3, the diffraction grating 36, the biprism device 9, the image detector 79 and the like.

Note that the above particle beam device system has been described based on a transmission electron microscope. Further, the particle beam device system may be applied to a charged particle beam device such as an ion microscope, a molecular beam device, a heavy particle beam device, a neutron beam device, and extensively, an electromagnetic wave device such as an X-ray device. It goes without saying that at that time, the configuration of the optical system is changed based on the characteristics of the respective devices. Note that many of the conceived particle beam devices are provided with a vacuum-evacuation system for vacuum evacuation of the particle beam deflecting system or the particle beam trajectory part, however, such elements are not directly related to the present invention, accordingly, illustration and explanations of these elements have been omitted.

Example 2

An example 2 is an example of a medical application device using an X-ray or a heavy particle beam. In radiotherapy treatment of cancer or the like, in some cases, upon irradiation of a patient's affected part with an X-ray, a heavy particle beam or the like, the same radiation is used in irradiation for the purpose of search for an affected part or observation and irradiation for the purpose of treatment of the affected part found by the search. In this case, as the irradiation ranges and the irradiation densities are different, it is impossible to perform simultaneous irradiation in almost all the cases. First, a weak and wide range is irradiated to find an affected part, then the affected part is irradiated at a pin point with a strong particle beam. However, exactly, when the strong particle beam is emitted, the affected part is not observed. The strong particle beam irradiation is performed based on the observation result upon previous search and on the assumption that it is reproduced with the same accuracy.

Figure 7:
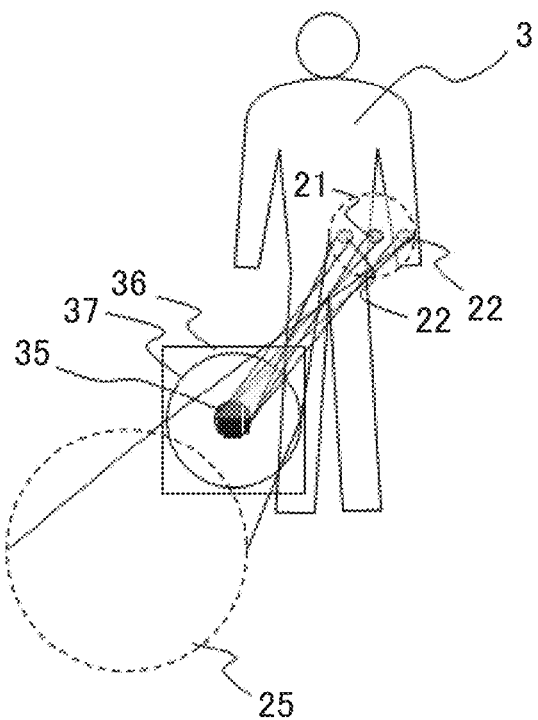
FIGS. 7(a) and 7(b) are schematic diagrams showing a basic configuration of a medical application according to an example 2.
Figure 7:
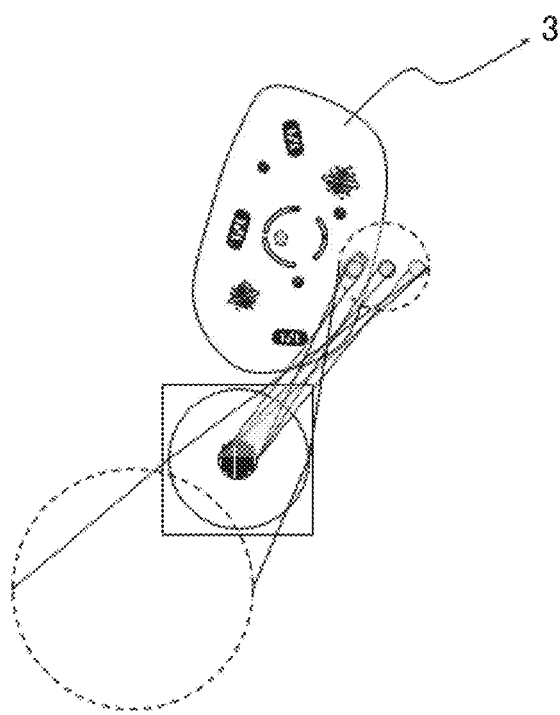

According to the present example, as shown in FIG. 7(a), it is possible to perform the radiotherapy treatment while performing affected part search observation as the specimen 3. That is, the irradiation region 37 is irradiated with a transmission wave part as a uniform and weak particle beam transmitting the region, to observe the entire image. The found affected part is irradiated at a pin point with the diffraction wave 22 with the opening region 35, thus the irradiation is utilized as treatment. With this configuration, in a status where the entire image is being observed, the aimed part is strongly irradiated. Accordingly, there is no mistake and it is not necessary to search the position again. As a result, it is possible to reduce the total exposure dose. The irradiation position is controlled by horizontal and/or vertical movement of the grating. Further, the diffraction grating 36 is attachable/removable to/from an optical system. After the detection of an affected part, by reducing the transparency of the grating to be inserted, it is possible to further reduce the irradiation dose. Further, regarding a part especially weak at X irradiation, by superposition of a zero-order diffraction wave shadow part 21, as a transmission wave, it is possible to more appropriately reduce the irradiation dose.

Note that the configuration of the present example is applicable not only to implementation as a treatment for a patient as a subject, but also to cellular-level research by reducing the size of the entire system. FIG. 7(b) illustrates the cellular-level treatment object as the specimen 3.

Example 3

Next, an example upon analysis or evaluation of an electromagnetic field, directly introduced with the particle beam in the specimen, with a similar configuration to the basic configuration and the device configuration described in the example 1, will be described as an example 3. With the present example, with density difference of an irradiation probe under uniform illumination, it is possible to perform irradiation in an aimed shape and size with respect to e.g. an electromagnetic specimen, and to control the effect of magnetism expression by irradiation. As in the case of the example 1, the control of the superposition-irradiation position with the diffraction wave is performed by movement of the diffraction grating in the vertical two-dimensional directions to the optical axis of the device. The control of the irradiation density of the irradiation probe is also realized by moving the diffraction grating in the optical axis direction of the device.

For example, it is also possible to handle an electromagnetic phenomenon introduced in a material by optical irradiation such as a light magnetic material or light dielectric, as an object. The light wave is controlled with an optical bench or the like, with much high freedom in comparison with that of an electron beam or other particle beams, however, in the case of ultraviolet ray or X-ray, the handling environment is similar to that of the electron beam and other particle beams due to shortage of effective optical elements. Accordingly, the present invention can be an effective observation means in these photoinduced phenomena.

More particularly, e.g., in a light magnetic material, it is possible to produce an orbital magnetization state similar to a skyrmion in the light magnetic material by irradiation with a small probe. When the irradiation probe size is a little increased, it is possible to produce a single magnetic domain structure or an inverted two magnetic domain structure. Further, as the irradiation region is increased, it is possible to produce a multiple magnetic domain structure. According to the present example, it is possible to directly observe these produced magnetic statuses and magnetic domain structures with the employed irradiation probe. The control of these magnetisms leads not to elucidation of elementary process of magnetization phenomenon of magnetic material as a physical phenomenon, but also to utilization of processing of a memory, operation control or the like in magnetic semiconductors. Further, in dielectrics, implementation and observation of dielectric phenomenon as in the case of the light magnetic material are possible, which contributes to elucidation of elementary process of electromagnetic phenomena derived from particle beam irradiation and observation of an organic thin film and the like.

Example 4

In other materials than the magnetic material, an example where it is possible, with a configuration similar to the basic configuration and the device configuration described in the example 1, to perform observation on an electromagnetic phenomenon directly introduced with the particle beam in a specimen material, will be described as an example 4. For example, in a non-porous type phase plate which is beginning to be used in a transmission electron microscope, it is estimated that, with an electric field introduced with a high-density electron beam itself, transmitted through the specimen and converged with an objective lens, into a carbon thin film, the phase of the electron beam itself is changed, and a phase plate effect is obtained. Note that the phase plate effect means applying a $\lambda/4$ phase difference between the transmission wave, i.e., zero-order diffraction wave and the diffraction wave transmitting through its peripheral part, with a phase plate, so as to obtain liner contrast in phase distribution by the effect of interference between the transmission wave and the diffraction wave at that time. For direct observation of this phenomenon, it is necessary to make the electron beam as a probe converge. However, the measurement itself is not performed since when the beam is converged, no electron beam exists in the peripheral part in the first place and the phase difference is not determined. That is, the direct inspection and evaluation of the phase plate in a use environment as a phase plate has not been realized.

However, according to the configuration according to the above-described example 1, it is possible to produce a similar situation to the phase plate use environment, i.e., a situation where the zero-order diffraction wave and its peripheral part exist. It is possible to directly observe the effect of the phase plate. Note that although it is considered that the phase plate is an effective means for observing a specimen from which a contrast is not obtained with an electron beam, such as a biological specimen or a dielectric specimen, there is no technique for directly evaluating the phase plate, and current development is in a trial-and-error situation. According to the present example, it is possible to provide the development of these phase plates with an effective technique.

Note that the effectiveness of the present example has been explained with the phase plate as an example, however, the electromagnetic phenomenon itself introduced with the particle beam into the specimen and expressed there is popular. According to the configuration according to the present example, it is possible to provide an effective means for observation of the electromagnetic phenomenon, directly introduced with the particle beam in these popular specimen materials.

Example 5

An example 5 is an example of an optical system for superposition irradiation of a specimen with a spiral wave. It is possible to utilize the spiral wave as an optical system for superposition irradiation of the specimen by replacing the diffraction grating in the basic configuration shown in FIG. 1 with the edge dislocation grating 45 shown in FIG. 4(c) or the spiral zone plate 46 shown in FIG. 4(d).

The spiral wave is a new particle beam, especially regarded in the field of electron beam as a probe in the next generation or more advanced generation. It has this name because an equiphase plane has a spiral structure. When a spiral wave is generated with a charged particle beam, there is a possibility that it becomes a particle beam which is propagated with magnetism. It is considered that it becomes an effective particle beam for detection of a magnetization component in an optical-axis vertical direction, observation of a spiral structure such as protein, or processing by utilizing magnetic characteristic.

Accordingly, in the present example, it is possible to irradiate a predetermined specimen with a uniform illumination particle beam transmitted through an opening outer peripheral part of a diffraction grating for observation on the specimen, and e.g. a spiral wave for magnetism observation, simultaneously, by replacing the diffraction grating with an edge dislocation grating for generation of a spiral wave. The control of the position of the spiral wave is realized by movement of the diffraction grating in the vertical two-dimensional directions to the device optical axis. Accordingly, it is possible to search for the position of a magnetic body at a pin point while observing the entire image of the specimen, or to perform magnetization with the spiral wave. Further, it is possible to realize position analysis of aimed protein within the biological specimen by replacing the above-described magnetic body with protein having a spiral structure. Further, it is possible to use the above-described spiral wave not for observation or analysis but also for material processing by adjusting the intensity of the spiral wave. The adjustment method is based on material or thickness of the diffraction grating, and setting position of the diffraction grating. The grating itself is adjusted by opening size, grating interval or the like.

Example 6

Figure 8:
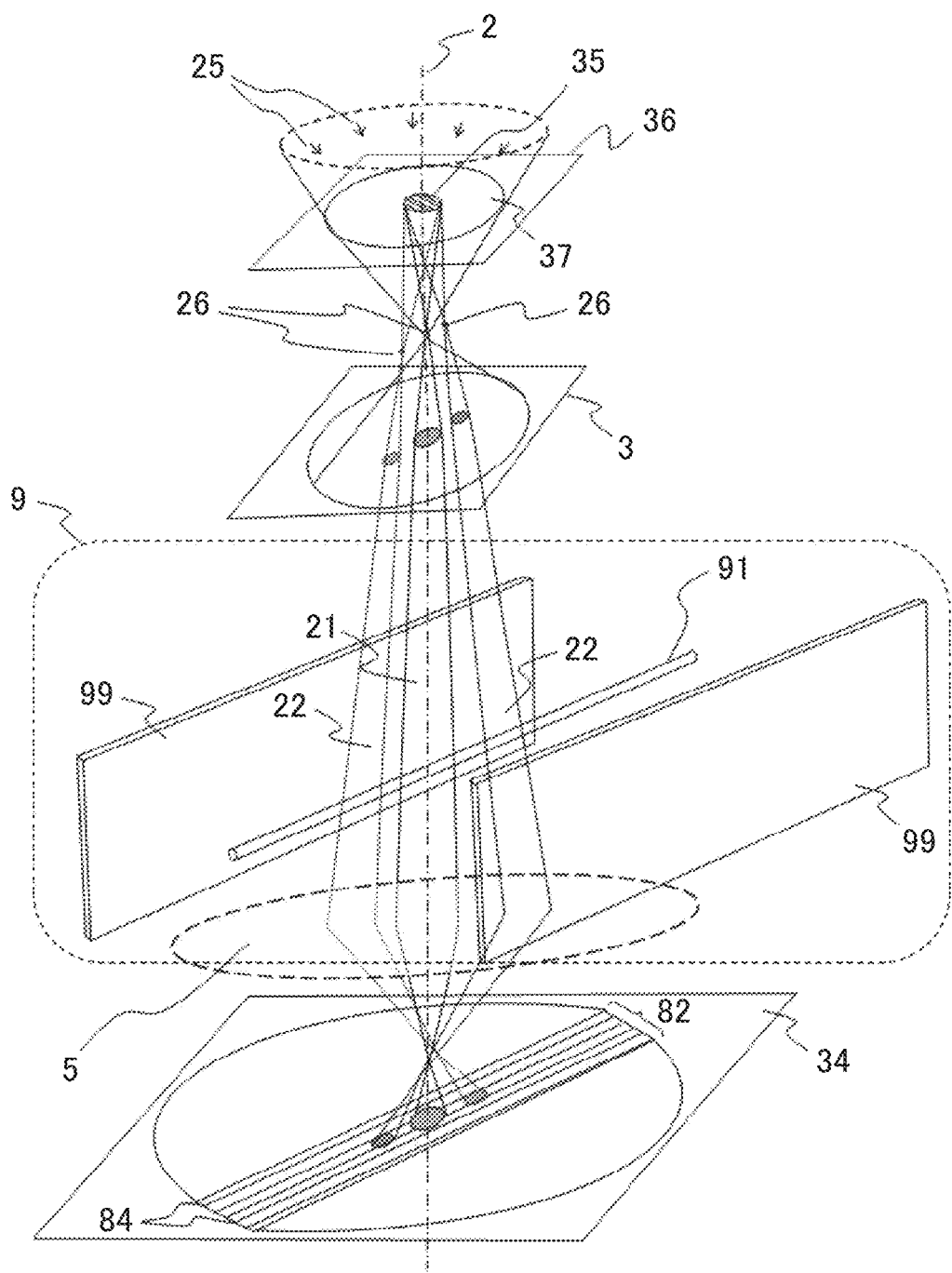
FIG. 8 is a schematic diagram showing an application to an interference optical system according to an example 6.

An example 6 is an example of the particle beam device to realize application to an interference measurement method. FIG. 8 is a schematic diagram showing a configuration of the optical system of the particle beam device according to the example 6. More particularly, the figure shows an example of the interference optical system using a biprism device in consideration of the transmission electron microscope.

The positional relationship among the diffraction grating 36, the specimen or the specimen plane 3, and the cross over 26 of the particle beam, shown in an upper part of FIG. 8 is the same as that in the optical system shown in FIG. 1. The irradiation region 37 wider than the opening region 35 of the diffraction grating 36 holding transparency is irradiated with the incident particle beam 25. Then the specimen or the specimen plane 3 is superposition-irradiated with the ±primary diffraction wave 22 diffracted with the opening as the opening region 35 and the transmission wave 21. At this time, in the transmission wave transmitted through the opening region 35, i.e., the zero-order diffraction wave, the intensity is lowered by the energy dispensation to the energy diffraction wave. With respect to the entire irradiation region on the specimen or the specimen plane 3, a shadow irradiation region where the irradiation intensity is lowered is produced. As a result, on the specimen or the specimen plane 3, with reference to the intensity of the particle beam, transmitted through the opening outer peripheral part of the diffraction grating 36 in the irradiation region 37 of the particle beam, three types of irradiation including the irradiation region where the intensity is higher than the reference intensity by the superposition of the diffraction wave, and the irradiation region where the intensity is lowered by the intensity dispensation to the diffraction wave, are simultaneously obtained.

The particle beam device in FIG. 8 is provided with, in addition to the above-described basic configuration described in FIG. 1, the biprism device 9 on the downstream side in the particle beam propagation direction in the specimen 3. The biprism device 9 is drawn in consideration of an electric-field type electron beam biprism in the electron microscope. It is configured such that a filament electrode 91 is provided on the optical axis 2 of the particle beam device, and two parallel plate ground electrodes 99 hold the filament electrode 91 between them. When the incident particle beam 25 to the biprism device 9 is a charged particle beam, it is possible to mutually superpose the particle beams having passed through the left and right of the filament electrode 91 by voltage application to the filament electrode 91. It is possible to observe the particle beam interference within the range where the particle beam holds coherence.

FIG. 8 shows an example of the interference optical system having a configuration where the biprism device 9 is inserted on the lower side of the specimen or the specimen plane 3 and on the upper side from the objective lens 5. This interference optical system is an optical system having an advantage that it enables observation of a wide range of interference region 82 at low magnification. The interference optical system is different from the optical system shown in FIG. 6 where the biprism device 9 is provided on the lower side of the objective lens 5 only in that the positional relationship is different. However, the fact remains that each of these devices is an interference optical system, and there is no limitation on any of the interference optical systems.

In the configuration of the particle beam device in FIG. 8, the objective lens 5 is focused on the specimen or the specimen plane 3, and the image of the specimen is imaged on an image plane 34. The specimen image includes regions superposition-irradiated with the two diffraction waves 22 and a shadow region 21 of the diffraction grating on the optical axis 2 of the device. The two diffraction wave superposition regions are irradiation regions stronger in comparison with other reference region. Accordingly, when an electromagnetic phenomenon such as charging has occurred inside the specimen or on the surface of the specimen in the strong irradiation region, the phenomenon is reflected as a phase change in the reference irradiation transmission wave. FIG. 8 shows the configuration of the interference optical system to measure the phase change. The measurement is realized by adjusting the azimuthal rotation of the diffraction grating or the biprism device, and the application voltage to the filament electrode, so as to include the superposition part of the diffraction wave in the interference region i.e. hologram region. Preferably, it is configured such that any one or more of the device holding the diffraction grating, the specimen holder, and the biprism device are azimuthally-rotatable about the optical axis as a rotation axis.

Note that in FIG. 8, the orientation direction of the diffraction spot as a diffraction occurrence direction is drawn from the upper right to the lower left with the optical axis 2 as a center. Further, the direction of the interference with the biprism device 9 i.e. a vertical direction to an interference fringe pattern 84 is drawn from the upper left to the lower right in the figure. By crossing the two interference directions, even when coherence exists between the diffraction wave 22 and the transmission wave transmitted through the opening outer peripheral part, it is possible to perform separation detection of the phase modulation occurred in the specimen 3 reflected in the transmission wave 21. When the shadow region of the opening as the opening region of the diffraction grating 36 and the superposition region of the diffraction wave 22 are greatly out of coherence length, i.e., when the distance between the diffraction grating and the specimen is long, the interference effect occurred in the optical system in FIG. 8 is only caused with the biprism device 9. Accordingly, it is not necessary to consider the above-described orthogonal relationship between the two interference characteristics. However, when the distance between the diffraction grating and the specimen is not sufficiently long in a device configuration, to improve the observation accuracy, the study on the orthogonality is a significant factor. Further, to obtain a long distance between the diffraction grating and the specimen, it is desirable that the imaging optical system such as an electromagnetic lens is not provided between the diffraction grating 36 and the specimen 3.

Example 7

An example 7 is an example of the electron microscope when coherence is held between the transmission wave from the diffraction grating and the diffraction wave, and its observation method. In this case, assuming that any one of the transmission wave and the diffraction wave is an object wave, and the other one, a reference wave, it is possible to realize holography. When the configuration according to the present example is adopted in the electron microscope, it is possible to realize electron beam holography even without the electron beam biprism described in the example 6.

Figure 9:
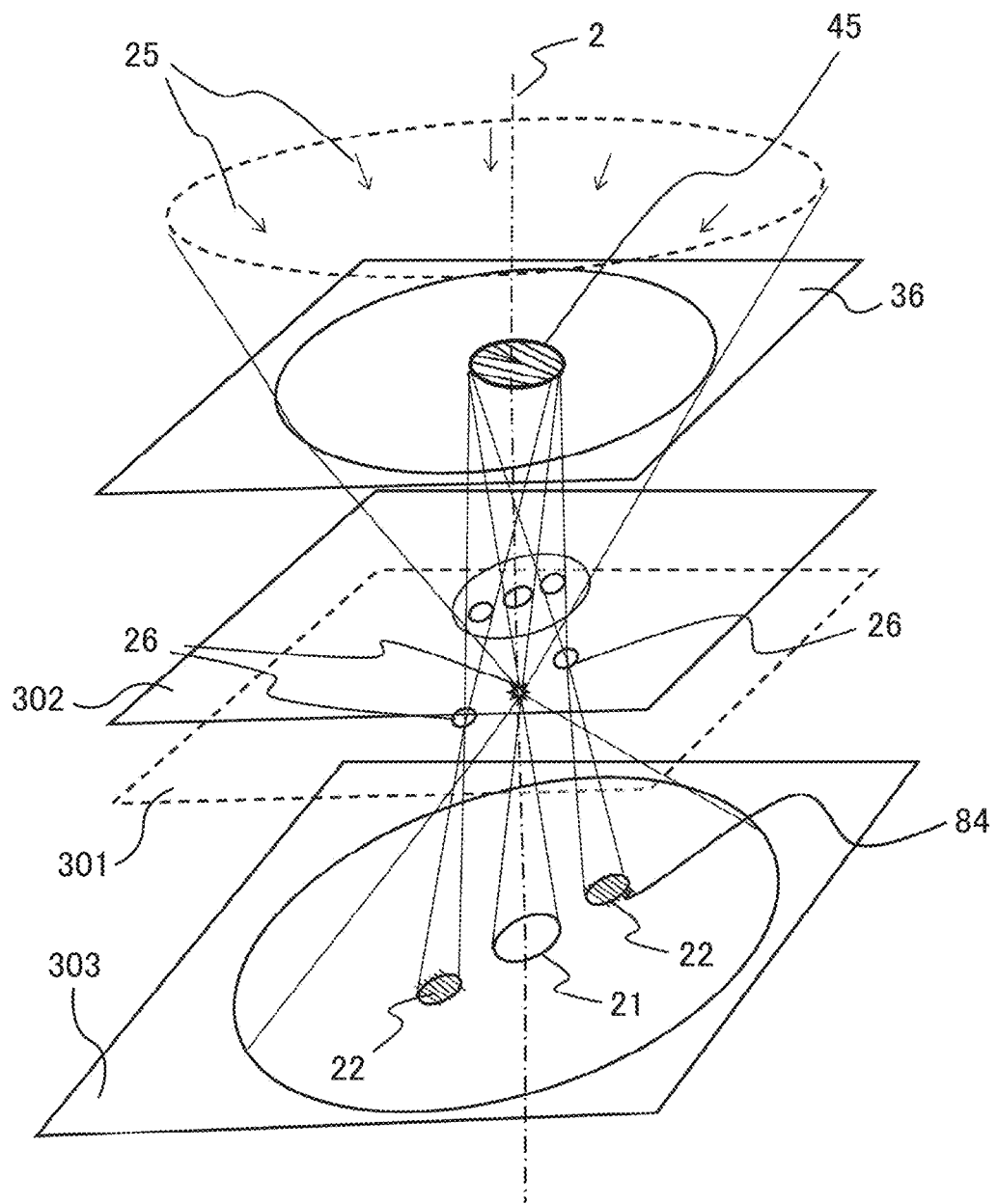
FIG. 9 is a schematic diagram explaining interference between a transmitted wave and a diffracted wave according to an example 7.

FIG. 9 shows the status of interference between the transmission wave 21 and the diffraction wave 22, according to the present example. In the present example, to provide the diffraction wave 22 with special expansion to facilitate exemplification of the interference fringe pattern 84 with respect to the transmission wave 21, the diffraction grating 36 to be inserted is the edge dislocation grating 45 for spiral wave generation, and as the diffraction wave 22, the ring-shaped diffraction spot 26 will be described. However, the following description is not limited to the used of the spiral wave.

In the wave transmitted through a part where the grating is engraved in the edge dislocation grating 45 and its outside, and in the wave diffracted with the edge dislocation grating 45, the position (height) on the optical axis 2 to form the cross over 26 is the same. The cross over 26 plane is an image plane of the light source, corresponding to a diffraction plane 301 as reciprocal space for the diffraction grating 36. Accordingly, when the diffraction grating 36 is the edge dislocation grating 45 for spiral wave generation, as described later using FIGS. 10(*a*) to 10(*c*), in addition to the spot 26 of the transmission wave, a ring-shaped diffraction spot 26 is generated.

The incident wave 25 emitted in a range wider than the edge dislocation grating 45 has a large convergence angle. Considering the propagation along the optical axis 2, the wave is transmitted through the edge dislocation grating 45, then is rapidly reduced, and becomes a spot on the diffraction plane 301. Thereafter, it is rapidly enlarged. As in the case of the transmission wave 21, the diffraction wave 22 is reduced by propagation, and becomes the diffraction spot 26 in the minimum size on the diffraction plane 301, then is enlarged. However, the degree of size change of the diffraction wave 22 is far smaller in comparison with the change of the transmission wave 21. Accordingly, by appropriately selecting the distance from the diffraction plane 301 and producing a defocus plane, it is possible to observe the space where the transmission wave 21 and the diffraction wave 22 are superposed with each other. When the transmission wave 21 and the diffraction wave 22 are within the range of spatially coherent length, the interference between these two waves is observed.

Figure 10:
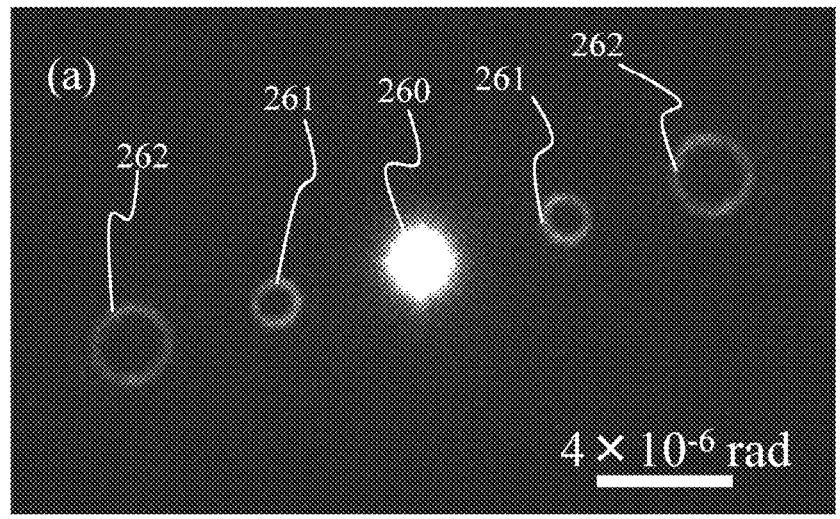
FIGS. 10(a) to 10(c) are diagrams showing an example of observation of superposition of the transmitted wave and the diffracted wave according to the example 7 along an optical axis.
Figure 10:
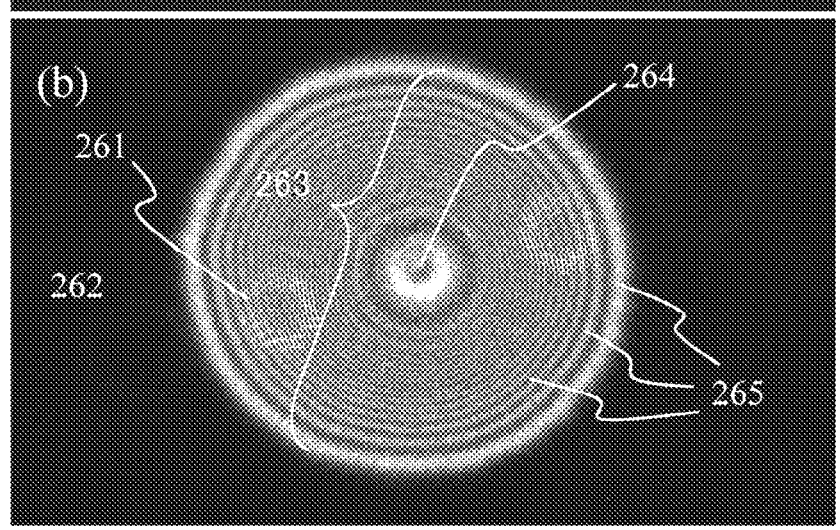
Figure 10:
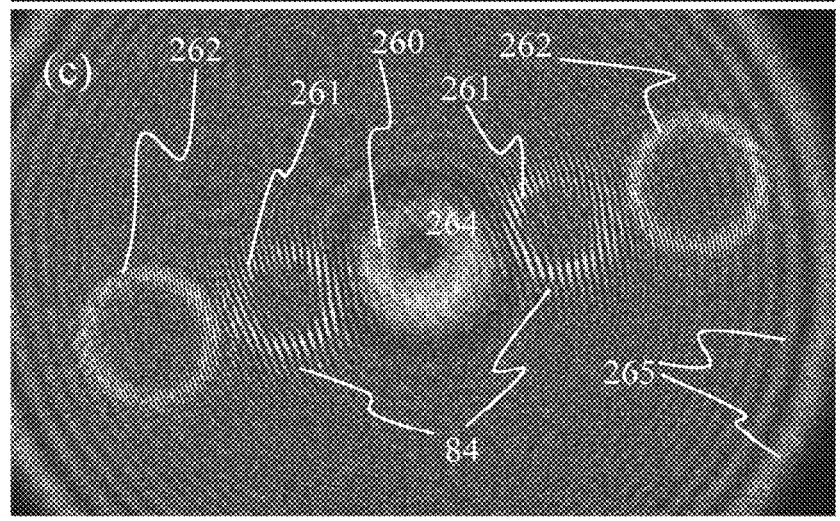

FIGS. 10(*a*) to 10(*c*) show an observation examples of the statuses of size change of the transmission wave 21 and the ±primary and ±secondary diffraction waves 22 by positional change on the optical axis 2. The figure shows an experimental example where the superposition of the transmission wave from a quinary edge dislocation grating (i.e., the topological number of the spiral wave generated as a diffraction wave is 5) and the diffraction wave is observed along the optical axis. FIG. 10(*a*) shows an observation image upon focus on the diffraction pattern, i.e., the diffraction plane 301; and FIGS. 10(*b*) and 10(*c*), in this order, images of observation while the out-of-focus amount is increased.

FIG. 10(*a*) shows a pattern on the diffraction plane 301 of the edge dislocation grating 45. With a transmission wave spot 260 as a center, total four ±primary and ±secondary diffraction spots are symmetrically arrayed. From the closest position to the transmission wave spot 260, ±primary diffraction spots 261, and ±secondary diffraction spots 262 are arrayed. The respective diffraction spots 261 and 262 are ring-shaped diffraction spots characterizing the spiral wave.

In FIGS. 10(*b*) and 10(*c*), a disc-shaped bright region 263 at a central part shows a spread status of the beam when the focus of the transmission wave is out of the diffraction plane. In the out-of-focus disc-shaped central part, a slightly-darker contrast part is a diffraction grating shadow 264. When the transmission wave 21 is slightly out of the diffraction plane, it spreads rapidly. Accordingly, in accordance with the out-of-focus amounts in FIGS. 10(*b*) and 10(*c*), the size of the disc-shaped bright region 263 is rapidly increased. On the other hand, the sizes of the diffraction spots 261 and 262 are not much changed through FIGS. 10(*a*), 10(*b*) and 10(*c*).

With this configuration, it is possible to observe individual interferences between the respective diffraction spots and the transmission wave.

In FIGS. 10(b) and 10(c), the diffraction spots 261 and 262 are respectively superposed with the transmission wave. The fringe pattern 84 is observed in the ring-shaped diffraction spots 261 and 262. This fringe pattern 84 is an interference fringe pattern between the transmission wave and the respective diffraction waves (spiral waves). The diffraction spots 261 and 262 superposed with the fringe pattern 84 are holograms of the respective spiral waves. Although the ring-shaped diffraction spots 261 and 262 in FIGS. 10(b) and 10(c) are not clearly shown due to the weak intensity at their center, they form an interference fringe pattern accompanied by edge dislocation similar to the edge dislocation grating shown in FIG. 4(c). Note that in FIGS. 10(b) and 10(c), a concentric-circle fringe pattern 265 shown around the spread transmission spot 260 is a Fresnel fringe caused by superposition of a Fresnel diffraction wave generated from the edge of a condenser aperture in the irradiation optical system.

Figure 11:
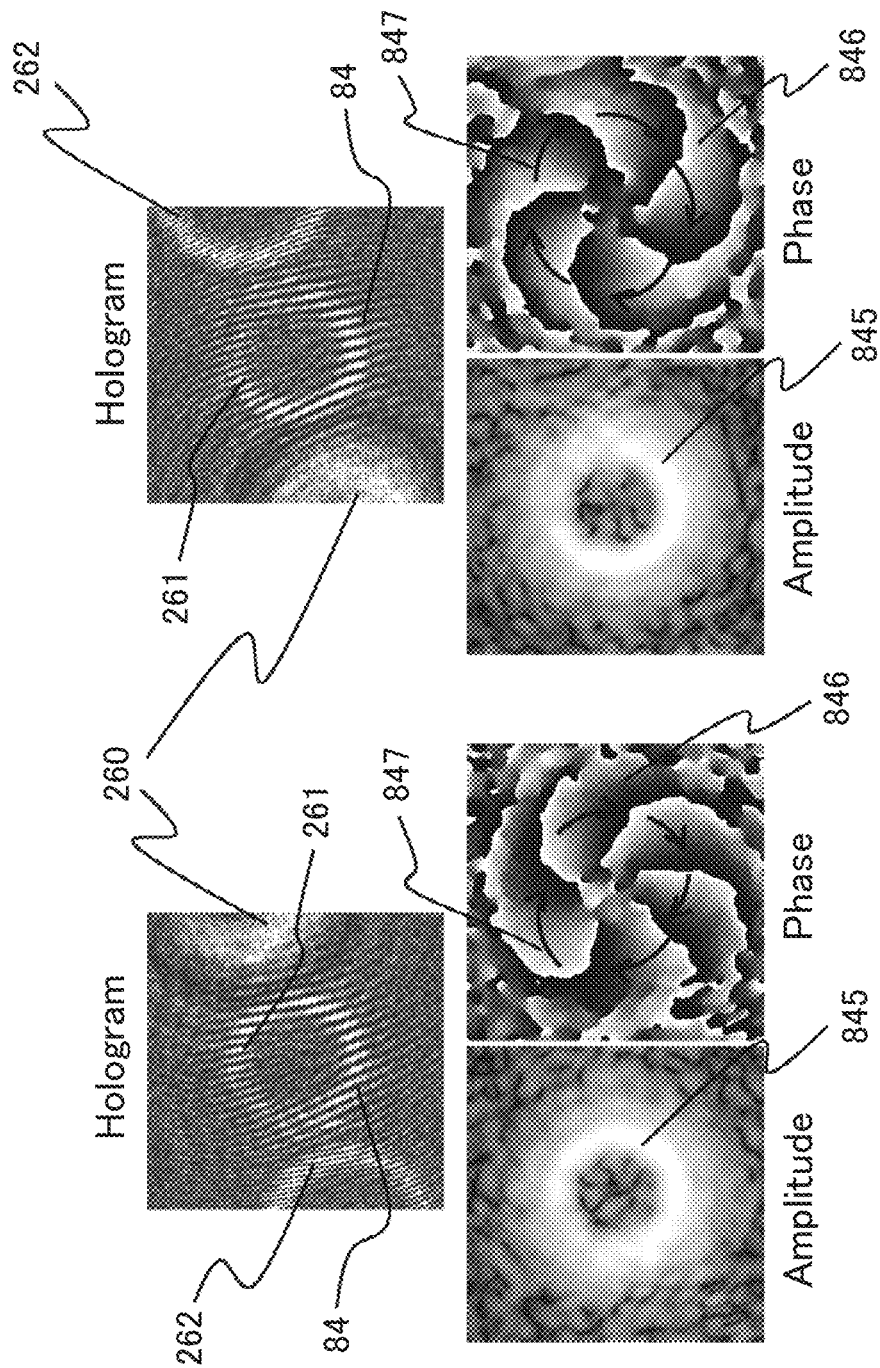
FIG. 11 is a diagram showing an example of a hologram, a reproduced amplitude image, and a reproduced phase image, according to the example 7.

FIG. 11 shows reproduced images when the ±primary diffraction spots in FIG. 10(c) are cut out as holograms (Hologram), and are reproduced by Fourier transform reproduction method. FIG. 11(a) shows a hologram of the −primary diffraction spot 261 on the left side in FIG. 10 and its reproduced amplitude (Amplitude) image and reproduced phase (Phase) image; and FIG. 11(b), a hologram of the +primary diffraction spot 261 on the right side and its reproduced amplitude image and reproduced phase image. Upon reproduction from the both holograms of the diffraction spots, i.e., images where the interference fringe pattern 84 is superposed on the ring-shaped diffraction spot 261, a phase distribution 846 of the reproduced phase image shows turn-like reproduction by 2π. Upon orbiting around the center of the phase distribution 846, 5 turnings are observed. That is, it clearly indicates that the reproduced phase image is a spiral wave of the diffraction wave having a topological number of 5. In FIG. 11, along with the amplitude images reproducing the ring shape 845, it is understood that the reproduction of the spiral wave is successful.

In the two reproduced phase images in FIGS. 11(a) and 11(b), the slopes of phase change as white-to-black color change directions indicated with an arrow 847 in the figure are both along the clockwise direction and correspond with each other. Although it seems strange that the phase distributions of the reproduced phase image in FIG. 11(b) as a hologram of a direct wave and the reproduced phase image in FIG. 11(a) as a hologram of a conjugate wave correspond with each other, the result is proper. The cause will be described simply as follows. The −primary diffraction wave, diffracted with the edge dislocation grating 45, is a conjugate wave. Upon reproduction of the hologram in FIG. 11(a) of the conjugate wave, total twice conjugation is performed by selecting a side band (corresponding to a reproduction wave) on the −primary side, and as a result, the phase distribution of a direct wave is restored. Accordingly, the slope of the phase change of the reproduced phase image in FIG. 11(a) corresponds with the slope of the reproduced phase image in FIG. 11(b). That is, the two reproduction waves in FIGS. 11(a) and 11(b) are the same including the amplitude and the phase in principle.

Figure 12:
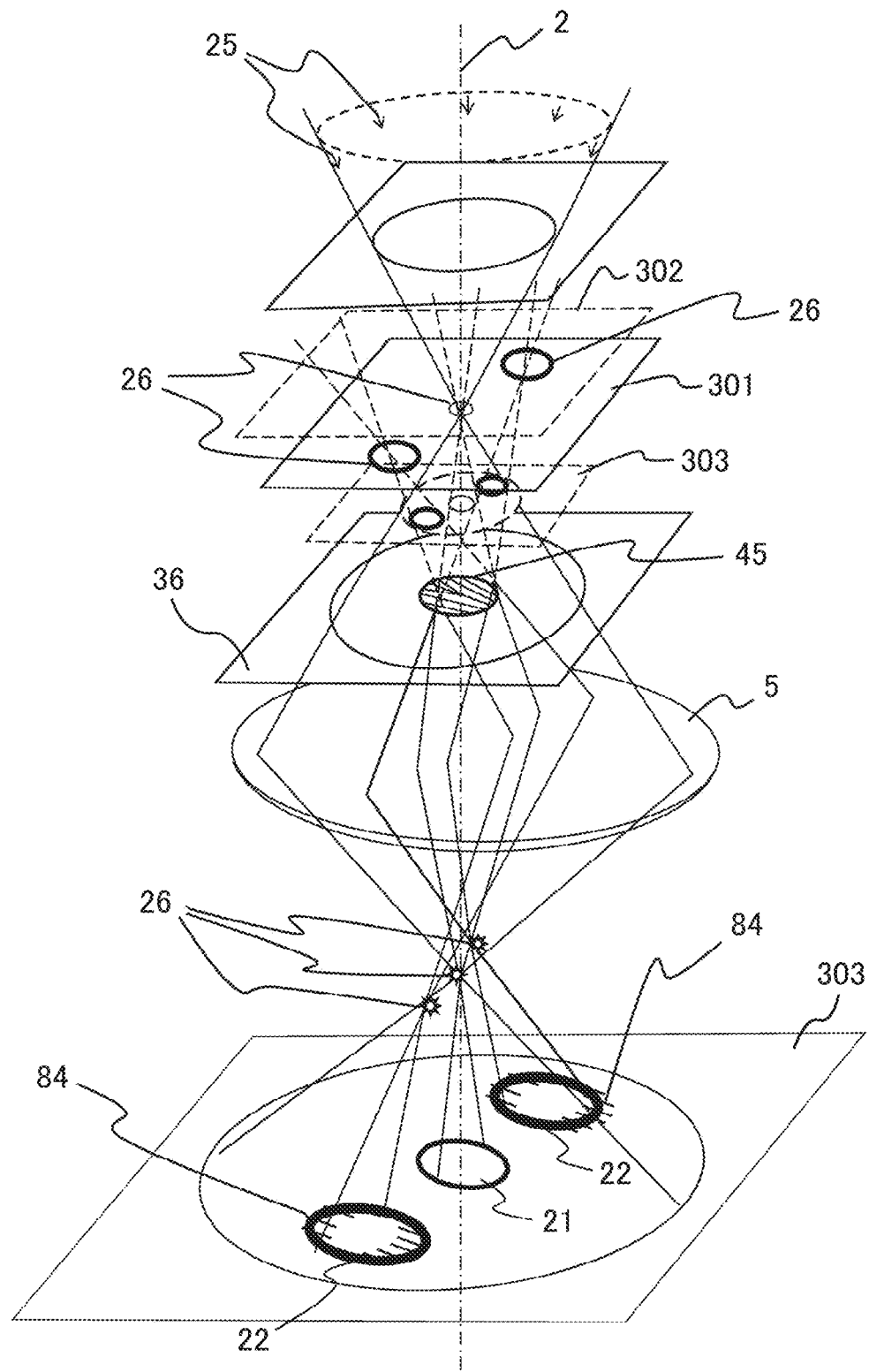
FIG. 12 is a schematic diagram showing an example of the interference optical system according to the example 7.

FIG. 12 shows the interference optical system when the observation in FIGS. 10(a) to 10(c) according to the present example is realized and the holograms in FIG. 11 are recorded. In this interference optical system, with the cross over 26 on the upstream side in the electron-beam flowing direction in the edge dislocation grating 45 as the diffraction plane 301, the positions of an under focus plane 302 above the plane 301 and an over focus plane 303 below the plane 301 are recorded. This corresponds to observation of virtual images for the edge dislocation grating 45. For the optical system, it is in conjugate relationship with and is equivalent to the optical system described in FIG. 9. The observation example of the experimental result in FIGS. 10(a) to 10(c) is observation of a virtual image on the upstream side in the electron-beam flowing direction in the edge dislocation grating 45 based on the optical system in FIG. 12. That is, as shown in the observation and the experimental result in FIG. 10 and FIG. 11, the optical system in FIG. 12 has a configuration without any trouble as an optical system for the present example. Further it is an optical system appropriate for ensuring a long camera length and obtaining a small-angle diffraction pattern.

Example 8

Figure 13:
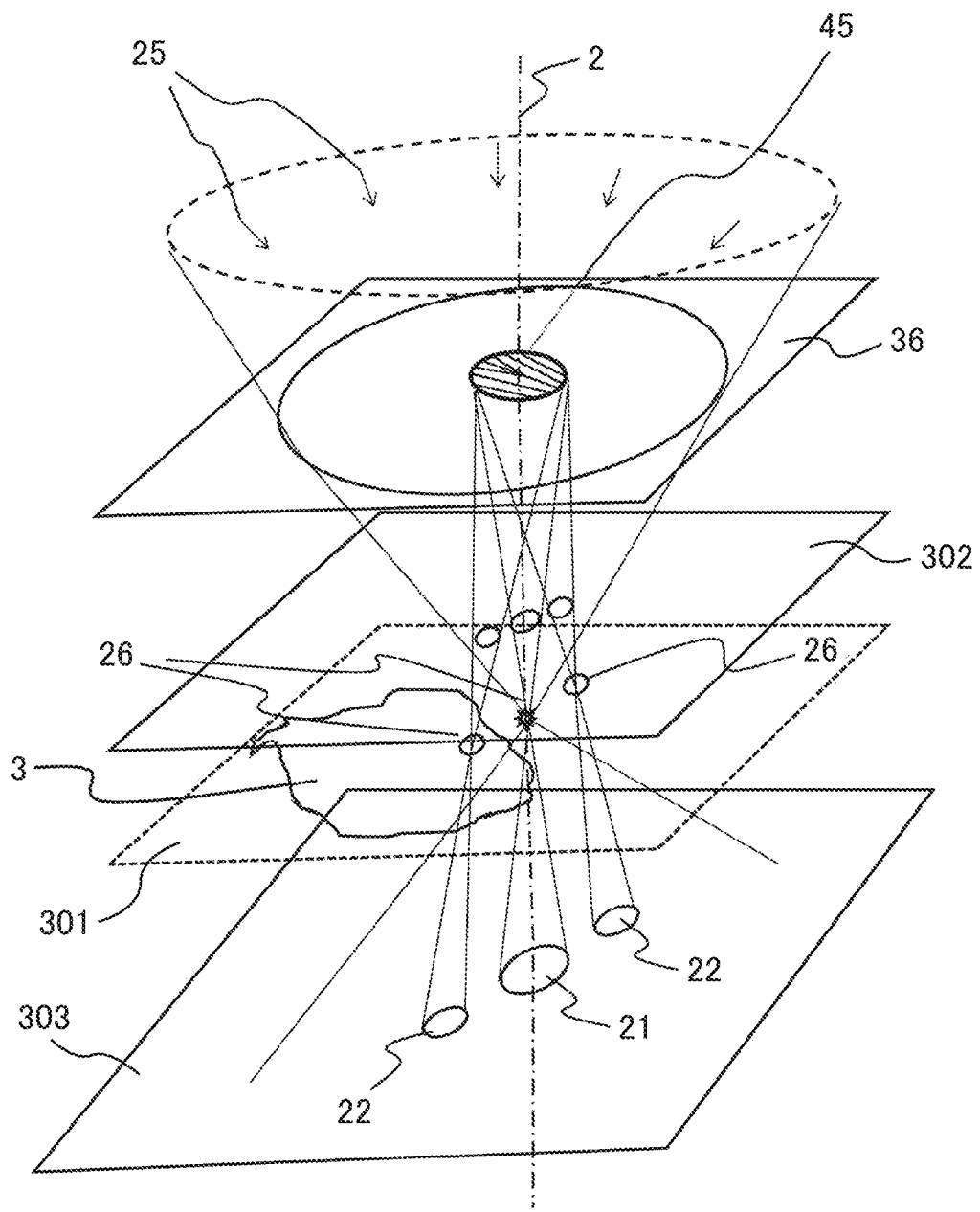
FIG. 13 is a schematic diagram of an optical system for hologram recording, according to an example 8.

FIG. 13 shows an example of a holography optical system according to an example 8, where, in the interference optical system between the transmission wave 21 transmitted through the edge dislocation grating 45 and the diffraction wave 22, the diffraction wave 22 is an object wave, while the transmission wave 21 is a reference wave. It goes without saying that contrary to the above configuration, it may be configured such that the diffraction wave 22 is a reference wave, while the transmission wave 21 is an object wave. Although not shown, for example, when the specimen 3 is a minute particle or the like, by providing the specimen 3 in a part of the transmission wave, and bringing a projected image of the minute particle into correspondence with the superposition region between the diffraction wave 22 and the transmission wave 21, a hologram recording, with the diffraction wave 22 as a reference wave, while with the transmission wave 21 as an object wave, is easily realized. In any way, the system is configured such that the edge dislocation grating 45 as a diffraction grating, and the specimen 3 provided on the diffraction plane 301 of the edge dislocation grating 45, in this order, are provided on the optical axis 2, in the traveling direction of the incident particle beam 25 as a charged particle beam.

In the configuration in FIG. 13, the specimen 3 as an observation object is provided on the diffraction plane 301 as reciprocal space for the edge dislocation grating 45, then the position of the interference between the diffraction wave 22 as a spiral wave transmitted through the specimen 3 and the transmission wave 21 is shifted upward or downward along the optical axis 2 from the diffraction plane 301 (the focus with reference to the diffraction plane 301 is changed to out-of-focus status) and is recorded. The transmission wave 21 is a reference wave, and the spiral wave (diffraction wave 22) transmitted through the specimen 3 is an object wave. In FIG. 9, the diffraction spot 26 of the spiral wave is transmitted through the specimen 3, and its hologram is recorded on the under focus plane 302 or the over focus plane 303. The method of reproduction from the recorded hologram is as described above. Note that the specimen is described, however, an observation object may be an electromagnetic field existing in space or a strain field inside a material. Anything can be an observation object as long as it applies modulation to the phase of an electron wave. They are generally referred to as specimen. In the configuration in FIG. 13, from the ease of illustration of the diffraction spot on the diffraction plane, the measurement of interference in the spiral wave using the edge dislocation grating 45 has been described. Also in the present example, there is no limitation on the spiral wave. It is possible to realize holography by using the optical system in FIG. 13. Especially in the case of the electron microscope, it is possible to realize electron beam holography without using an electron beam biprism.

According to the above-described various examples of the present invention, it is possible to provide a particle beam device, with which it is possible to observe the influence of irradiation with an irradiation particle beam, superposed or reduced by diffraction, to a specimen, along with the status of the peripheral part, with reference to an irradiation amount with a particle beam, transmitted through without diffraction with the diffraction grating, and its observation method.

Note that the above-described various examples have been explained for deep understanding of the present invention, but the invention is not limited to an example having all the described constituent elements. For example, it may be configured such that the outer peripheral part of the opening region of the diffraction grating does not exist in the entire periphery of the opening region, but is provided in only a part. Further, a part of constituent elements of an example may be replaced with those of another example, and further, a part of constituent elements of an example may be added to those of another example. Further, it is possible to perform addition/deletion/replacement with respect to a part of constituent elements of the respective examples with other constituent elements.

For example, although illustration is omitted, in the configurations of the example 1 to the example 8, by providing plural diffraction gratings in an irradiation region of an incident particle beam, it is possible to perform simultaneous superposition irradiation in plural positions using diffraction waves from the respective diffraction gratings. At this time, when it is configured such that the opening shape, the grating pattern and the like of the diffraction gratings are arbitrarily variable as parameters, it is possible to superposition-irradiate a more complicated pattern in correspondence with status of irradiation object. For example, in the case of medical application as in the case of the example 2, it is possible to perform irradiation while controlling the particle beam to a shape corresponding to a patient's affected part or to a required intensity.

Further, an example of use of a system control computer on which a program to realize a part or all of the respective constituent elements, functions, controllers and the like operates, has been described. It goes without saying that a part or all of them may be realized with hardware by designing as e.g. an integrated circuit. That is, all or a part of functions of the controller may be replaced with a program, and realized with an integrated circuit or the like such as an ASIC (Application Specific Integrated Circuit) or an FPGA (Field Programmable Gate Array).

REFERENCE SIGNS LIST

1 . . . electron gun or particle source
18 . . . vacuum container
19 . . . particle source control unit
2 . . . optical axis
21 . . . transmission wave
22 . . . diffraction wave
23 . . . irradiation region
25 . . . incident particle beam
26 . . . cross over
260 . . . spot
261, 262 . . . diffraction spot
263 . . . bright region
264 . . . shadow of diffraction grating
265 . . . fringe pattern
3 . . . specimen or specimen plane
30 . . . substrate
301 . . . diffraction plane
302 . . . under focus plane
303 . . . over focus plane
31 . . . stem
32 . . . thin film
33 . . . reinforcing bridge
34 . . . specimen image or specimen image plane
35 . . . opening region
36 . . . diffraction grating
37 . . . particle beam irradiation region
38 . . . diffraction grating control unit
39 . . . specimen holder control unit
4 . . . charged particle beam device
40 . . . accelerating tube
41 . . . first condenser lens
42 . . . second condenser lens
43 . . . straight grating
44 . . . zone plate
45 . . . edge dislocation grating
46 . . . spiral zone plate
47 . . . second condenser lens control unit
48 . . . first condenser lens control unit
49 . . . accelerating tube control unit
5 . . . objective lens
51 . . . system control computer
52 . . . system control computer monitor
53 . . . system control computer interface
59 . . . objective lens control unit
61 . . . first imaging lens
62 . . . second imaging lens
63 . . . third imaging lens
64 . . . fourth imaging lens
66 . . . fourth imaging lens control unit
67 . . . third imaging lens control unit
68 . . . second imaging lens control unit
69 . . . first imaging lens control unit
75 . . . image detection plane
76 . . . image data monitor
77 . . . image data recording device
78 . . . image data controller
79 . . . image detector
8 . . . final image
82 . . . interference region
84 . . . interference fringe pattern
845 . . . ring shape
846 . . . phase distribution
847 . . . arrow
9 . . . biprism device
91 . . . filament electrode
98 . . . biprism device control unit
99 . . . parallel plate ground electrode

The invention claimed is:

1. A particle beam device comprising:
a particle beam source that generates a particle beam;
an irradiation unit that emits the particle beam to a specimen;
a specimen holder that holds the specimen;
a detection unit that detects the particle beam transmitted through the specimen;
a diffraction grating, provided on the upstream side of the specimen in a traveling direction of the particle beam, and on the downstream side in the traveling direction of the particle beam in the irradiation unit, that is configured with a material having transparency with respect to the particle beam; and a holding device that enables attachment/removal and movement of the diffraction grating with respect to an optical axis of the particle beam device, wherein an opening region disposed at a center portion of the diffraction grating is smaller than an irradiation region of the particle beam to the diffraction grating, wherein said opening region diffracts said particle beam, and wherein an irradiation region of said particle beam as emitted from said diffraction grating to said specimen has a first portion that includes the optical axis of the particle beam device, and also has a plurality of second portions each disposed apart from said first portion on a plane which includes said specimen, and wherein an intensity of said particle beam is lower at said first portion which includes the optical axis of the particle beam device than an intensity of said particle beam at each said second portion.

2. The particle beam device according to claim 1, wherein the particle beam is a charged particle beam, wherein the particle beam device further comprises:

an objective lens system having at least one lens for imaging the charged particle beam transmitted through the specimen; and an imaging optical system having a plurality of lenses provided on the downstream side in the traveling direction of the charged particle beam in the objective lens system, and wherein the detection unit obtains an image of the specimen with the imaging optical system.

3. The particle beam device according to claim 2, wherein the irradiation region of the specimen with the particle beam is controlled with a position of a convergent point of the charged particle beam generated with the irradiation unit.

4. The particle beam device according to claim 2, wherein the diffraction grating, and the specimen placed on the diffraction plane of the diffraction grating, are provided in this order in the traveling direction of the charged particle beam on the optical axis.

5. The particle beam device according to claim 3, wherein the convergent point, the diffraction grating, and the specimen provided in this order, otherwise, the diffraction grating, the convergent point, and the specimen are provided in this order, in the traveling direction of the charged particle beam on the optical axis.

6. The particle beam device according to claim 3, wherein the diffraction grating, the specimen, and the convergent point are provided in this order in the traveling direction of the charged particle beam on the optical axis.

7. The particle beam device according to claim 2, wherein one or both of the objective lens system and the imaging optical system are provided with a biprism device arranged to provide interference in a direction which is orthogonal to a diffraction azimuth of a diffracted beam emitted from the diffraction grating.

8. The particle beam device according to claim 7, wherein one or more of the holding device of the diffraction grating, the specimen holder, and the biprism device, are azimuthally rotatable about an axis parallel to the optical axis as a rotation axis.

9. An observation method with a charged particle beam device, the method comprising:

holding a specimen using a specimen holder;
generating a charged particle beam using a source;
emitting the charged particle beam to the specimen; and
imaging the charged particle beam using an objective lens system having at least one lens which images the charged particle beam transmitted through the specimen, wherein said imaging uses an optical system having a plurality of lenses provided on a downstream side in a traveling direction of the charged particle beam in the objective lens system, and a diffraction grating provided on an upstream side of the specimen in the traveling direction of the charged particle beam and on the downstream side in the traveling direction of the charged particle beam in the irradiation unit, wherein said diffraction grating is configured with a material having transparency with respect to the charged particle beam, and wherein an opening region disposed at a center portion of the diffraction grating is smaller than an irradiation region of the charged particle beam to the diffraction grating, and observation is performed on a status where the irradiation region of the charged particle beam, diffracted with the diffraction grating formed on the specimen, is within the irradiation region of the charged particle beam transmitted through the diffraction grating, wherein said opening region diffracts said particle beam, and wherein the irradiation region of the charged particle beam transmitted through the diffraction grating to said specimen has a first portion that includes an optical axis of the charged particle beam device, and also has a plurality of second portions each disposed apart from said first portion on a plane which includes said specimen, and wherein an intensity of said particle beam is lower at said first position which includes the optical axis of the charged particle beam device than an intensity of said charged particle beam at each said second portion.

10. The observation method according to claim 9, further comprising:

performing said imaging based on a status of interference between the irradiation region of the charged particle beam diffracted with the diffraction grating formed on the specimen, and the irradiation region of the charged particle beam transmitted through the diffraction, wherein the charged particle beam device has a biprism device in one or both of the objective lens system and the imaging optical system device arranged to provide interference in a direction which is orthogonal to a diffraction azimuth of the charged particle beam diffracted with the diffraction grating.

* * * * *